(12) United States Patent
Nakamura

(10) Patent No.: US 9,078,364 B2
(45) Date of Patent: Jul. 7, 2015

(54) ELECTROCONDUCTIVE SHEET AND TOUCH PANEL

(71) Applicant: FUJIFILM Corporation, Minato-ku, Tokyo (JP)

(72) Inventor: Hiroshige Nakamura, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/271,512

(22) Filed: May 7, 2014

(65) Prior Publication Data

US 2014/0238730 A1      Aug. 28, 2014

Related U.S. Application Data

(60) Division of application No. 14/264,879, filed on Apr. 29, 2014, which is a continuation of application No. PCT/JP2012/082030, filed on Dec. 11, 2012.

(30) Foreign Application Priority Data

Dec. 16, 2011   (JP) ................................. 2011-276069
Dec. 16, 2011   (JP) ................................. 2011-276070
Dec. 22, 2011   (JP) ................................. 2011-281926

(51) Int. Cl.
*H05K 1/02* (2006.01)
*B32B 15/14* (2006.01)
(Continued)

(52) U.S. Cl.
CPC .............. *H05K 1/0296* (2013.01); *B32B 15/14* (2013.01); *G06F 3/041* (2013.01); *G06F 3/044* (2013.01); *H05K 1/0274* (2013.01); *H05K 2201/09245* (2013.01); *G06F 2203/04112* (2013.01)

(58) Field of Classification Search
USPC ............................ 174/253; 345/173; 200/600
See application file for complete search history.

(56) References Cited

U.S. PATENT DOCUMENTS

| 5,113,041 A | 5/1992 | Blonder et al. |
| 7,202,859 B1 | 4/2007 | Speck et al. |
| 2003/0052867 A1 | 3/2003 | Shigetaka et al. |

(Continued)

FOREIGN PATENT DOCUMENTS

| CN | 102129320 A | 7/2011 |
| CN | 102216891 A | 10/2011 |

(Continued)

OTHER PUBLICATIONS

Notification for the Opinion of Examination, dated Jul. 9, 2014, issued in corresponding TW Application No. 101147588, 14 pages in English and Chinese.

(Continued)

*Primary Examiner* — Timothy Thompson
*Assistant Examiner* — Michael F McAllister
(74) *Attorney, Agent, or Firm* — Sughrue Mion, PLLC

(57) ABSTRACT

The present invention provides an electroconductive sheet and a touch panel which do not impair visibility in a vicinity of an electrode terminal in a sensing region. In an electroconductive sheet which has an electrode pattern constructed of a metal thin wire and an electrode terminal that is electrically connected to an end of the electrode pattern, a transmittance of the electrode pattern is 83% or more, and when the transmittance of the electrode pattern is represented by a %, a transmittance of the electrode terminal is controlled to be (a-20)% or more and (a-3)% or less.

9 Claims, 8 Drawing Sheets

(51) Int. Cl.
  *G06F 3/041* (2006.01)
  *G06F 3/044* (2006.01)

(56) References Cited

U.S. PATENT DOCUMENTS

| | | |
|---|---|---|
| 2004/0229028 A1 | 11/2004 | Sasaki et al. |
| 2004/0239650 A1 | 12/2004 | Mackey |
| 2004/0239861 A1* | 12/2004 | Uchida .................. 349/149 |
| 2008/0211371 A1 | 9/2008 | Sasaki et al. |
| 2009/0219257 A1 | 9/2009 | Frey et al. |
| 2009/0219258 A1* | 9/2009 | Geaghan et al. .......... 345/173 |
| 2011/0227858 A1 | 9/2011 | An et al. |
| 2011/0290631 A1* | 12/2011 | Kuriki .................. 200/600 |
| 2012/0193130 A1 | 8/2012 | Fix et al. |

FOREIGN PATENT DOCUMENTS

| | | |
|---|---|---|
| EP | 2113827 A2 | 11/2009 |
| EP | 2390771 A2 | 11/2011 |
| JP | 05224818 A | 9/1993 |
| JP | 2003099185 A | 4/2003 |
| JP | 2006-344163 * | 12/2006 |
| JP | 2009129295 A | 6/2009 |
| JP | 2010251230 A | 11/2010 |
| JP | 2010262529 A | 11/2010 |
| JP | 2011175967 A | 9/2011 |
| TW | 201131456 A1 | 9/2011 |
| TW | 201133065 A1 | 10/2011 |
| WO | 9527334 A1 | 10/1995 |
| WO | 9718508 A1 | 5/1997 |
| WO | 2006001461 A1 | 1/2006 |
| WO | 2009108765 A2 | 9/2009 |
| WO | 2010057059 A1 | 5/2010 |
| WO | 2010108692 A2 | 9/2010 |
| WO | 2011062301 A1 | 5/2011 |

OTHER PUBLICATIONS

International Search Report, mailed Mar. 12, 2013, issued in corresponding International Application No. PCT/JP2012/082030, 2 pages in English.
International Preliminary Report on Patentability and Written Opinion, mailed Jun. 26, 2014, issued in corresponding International Application No. PCT/JP2012/082030, 11 pages in English and Japanese.
Decision of Refusal, dated Oct. 29, 2014, issued in corresponding TW Application No. 101147588, 15 pages in English and Chinese.
First Notification of Office Action, dated Dec. 10, 2014, issued in corresponding CN Application No. 201280053290.5, 14 pages in English and Chinese.
Communication, dated Feb. 4, 2015, issued in corresponding EP Application No. 14171329.7, 11 pages in English.
Communication, dated Apr. 10, 2015, issued in corresponding EP Application No. 12857606.3, 9 pages in English.
Notification of Reasons for Rejection, dispatched Apr. 30, 2015, issued in corresponding JP Application No. 2011-276069, 5 pages in English and Japanese.

* cited by examiner

ELECTROCONDUCTIVE SHEET AND TOUCH PANEL

This application is a divisional of U.S. application Ser. No. 14/264,879, filed Apr. 29, 2014, which is a continuation of PCT/JP2012/082030, filed Dec. 11, 2012, which claims priority from JP 2011-276069 and JP 2011-276070, both filed Dec. 16, 2011, and JP 2011-281926, filed Dec. 22, 2011, all of which are incorporated herein by reference in their entirety.

BACKGROUND OF THE INVENTION

1. Field of the Invention

The present invention relates to an electroconductive sheet and a touch panel, and relates to, for instance, an electroconductive sheet which is used in a projected capacitive touch panel and the touch panel.

2. Description of the Related Art

A transparent electroconductive film which uses a metal thin wire has been continuously studied as described in U.S. Patent Application Publication No. 2004/0229028 and International Publication No. WO 2006/001461, for instance.

Recently, a touch panel has received attention. The touch panel is mainly applied to devices having a small size such as a PDA (personal digital assistant) and a cellular phone, but is considered to be progressively applied to devices having a larger size such as a display for a personal computer.

In such a trend of the future, a conventional electrode employs ITO (indium tin oxide). The ITO has problems in that the resistance is large, a transmission speed of an electric current between electrodes becomes slow, and a response speed (period of time between the time when finger has touched and the time when position is detected) becomes slow, as the application size increases.

Then, it is considered to lower the surface resistance by an electrode constructed of the metal thin wire. As for a touch panel in which the metal thin wire is used for the electrode, Japanese Patent Application Laid-Open No. H5-224818, U.S. Pat. No. 5,113,041, International Publication No. WO 1995/27334, U.S. Patent Application Publication No. 2004/0239650, U.S. Pat. No. 7,202,859, International Publication No. WO 1997/18508 and Japanese Patent Application Laid-Open No. 2003-099185 are known, for instance.

SUMMARY OF THE INVENTION

By the way, a sensing electrode of a touch panel has an electrode pattern which includes, at least, a metal thin wire at least in a touch region and an electrode terminal which is electrically connected to an end of the electrode pattern. The electrode terminal is a thick terminal (solid terminal) so as to have high electroconductivity. Therefore, when a display and the touch panel are operated in combination, the electrode terminal shields light emitted from the display in a sensing region (electrode pattern). Accordingly, a darkened portion appears in a vicinity of the electrode terminal in the sensing region, and the display occasionally becomes less-viewable.

The present invention has been made in consideration of such problems, and aims to provide an electroconductive sheet and a touch panel which do not impair visibility in the vicinity of the electrode terminal in the sensing region.

A first electroconductive sheet according to the present invention is an electroconductive sheet which includes: an electrode pattern constructed of a metal thin wire; and an electrode terminal that is electrically connected to an end of the electrode pattern, wherein a transmittance of the electrode pattern is 83% or more, and when the transmittance of the electrode pattern is represented by a %, a transmittance of the electrode terminal is (a-20)% or more and (a-3)% or less.

The first electroconductive sheet of another aspect according to the present invention is an electroconductive sheet which includes: an electrode pattern constructed of a metal thin wire; and an electrode terminal that is electrically connected to an end of the electrode pattern, wherein an aperture ratio of the electrode pattern is 90% or more, and when the aperture ratio of the electrode pattern is represented by b %, an aperture ratio of the electrode terminal is (b-20)% or more and (b-0.1)% or less.

In the above described first electroconductive sheet according to the present invention, it is preferable that the electrode terminal include a mesh shape formed of lattices constructed of a metal thin wire, the metal thin wire has a line width of 30 μm or less, and the metal thin wire is made from an opaque material.

A first touch panel according to the present invention is a touch panel having an electroconductive sheet which includes: an electrode pattern that is provided in a sensing region and is constructed of a metal thin wire; and an electrode terminal that is provided in an outside of the sensing region and is electrically connected to an end of the electrode pattern, wherein a transmittance of the electrode pattern is 83% or more, and when the transmittance of the electrode pattern is represented by a %, a transmittance of the electrode terminal is (a-20)% or more and (a-3)% or less.

A first touch panel of another aspect according to the present invention is a touch panel having an electroconductive sheet which includes: an electrode pattern that is provided in a sensing region and is constructed of a metal thin wire; and an electrode terminal that is provided in an outside of the sensing region and is electrically connected to an end of the electrode pattern, wherein an aperture ratio of the electrode pattern is 90% or more, and when the aperture ratio of the electrode pattern is represented by b %, an aperture ratio of the electrode terminal is (b-20)% or more and (b-0.1)% or less.

A second electroconductive sheet according to the present invention is an electroconductive sheet including: an electrode pattern constructed of a metal thin wire; and an electrode terminal that is electrically connected to an end of the electrode pattern, wherein the electrode terminal includes a frame shape constructed of a metal thin wire.

In the second electroconductive sheet according to the present invention, preferably, when a line width of the thin wire of the electrode pattern is represented by a (μm), a line width b (μm) of the frame shape of the electrode terminal satisfies b≥2a or b≥a+5 (μm). The line width a (μm) of the thin wire of the electrode pattern is preferably 30 μm or less.

The second electroconductive sheet according to the present invention, preferably further including a mesh shape provided in the frame shape of the electrode terminal constructed of the metal thin wire, the mesh shape which is formed of lattices constructed of a metal thin wire.

A second touch panel according to the present invention is a touch panel having an electroconductive sheet which includes: an electrode pattern that is provided in a sensing region and is constructed of a metal thin wire; and an electrode terminal that is provided in an outside of the sensing region and is electrically connected to an end of the electrode pattern, wherein the electrode terminal includes a frame shape constructed of a metal thin wire.

A third electroconductive sheet according to the present invention is an electroconductive sheet including: an electrode pattern constructed of a metal thin wire; and an electrode terminal that is electrically connected to an end of the electrode pattern, wherein the electrode terminal includes a mesh shape formed of lattices constructed of a metal thin wire.

In the third electroconductive sheet according to the present invention, it is preferable that the electrode pattern be the mesh shape formed of lattices, and a pitch of the mesh shape formed of the lattices of the electrode terminal be denser than a pitch of the mesh shape formed of the lattices of the electrode pattern. The pitch of the mesh shape formed of the lattices of the electrode terminal is preferably not larger than ¾ of the pitch of the mesh shape formed of the lattices of the electrode pattern, more preferably is not larger than ⅔ thereof, and further more preferably is not larger than ½ thereof. The specific pitch of the mesh shape of the electrode terminal is 50 μm or more and 300 μm or less, and more preferably is 50 μm or more and 250 μm or less.

The third electroconductive sheet according to the present invention, preferably further including a frame shape constructed of a metal thin wire, the frame shape which is provided as an outer frame of the mesh shape formed of the lattices of the electrode terminal.

In the third electroconductive sheet according to the present invention, it is preferable that a surface resistance value of the electrode terminal be 4 Ω/sq. or more and 80 Ω/sq. or less.

A third touch panel according to the present invention is a touch panel having an electroconductive sheet which includes: an electrode pattern that is provided in a sensing region and is constructed of a metal thin wire; and an electrode terminal that is provided in an outside of the sensing region and is electrically connected to an end of the electrode pattern, wherein the electrode terminal includes a mesh shape formed of lattices constructed of a metal thin wire.

The electroconductive sheet and the touch panel according to the present invention can prevent visibility from being impaired in the vicinity of an electrode terminal in a sensing region.

DETAILED DESCRIPTION OF THE PREFERRED EMBODIMENTS

Preferable embodiments according to the present invention are described below with reference to the attached drawings. The present invention is described below with reference to preferable embodiments, but can be modified by many techniques without exceeding the scope of the present invention, and can make use of other embodiments than the present embodiment. Accordingly, all modifications in the scope of the present invention are included in the claims.

The electroconductive sheet and the touch panel according to the present embodiment are described below with reference to FIG. 1 to FIG. 7. Incidentally, "to" which indicates a range between numeric values in the present specification is used as meaning including the numeric values described in front and back of "to", as the lower limit and the upper limit.

Figure 1:
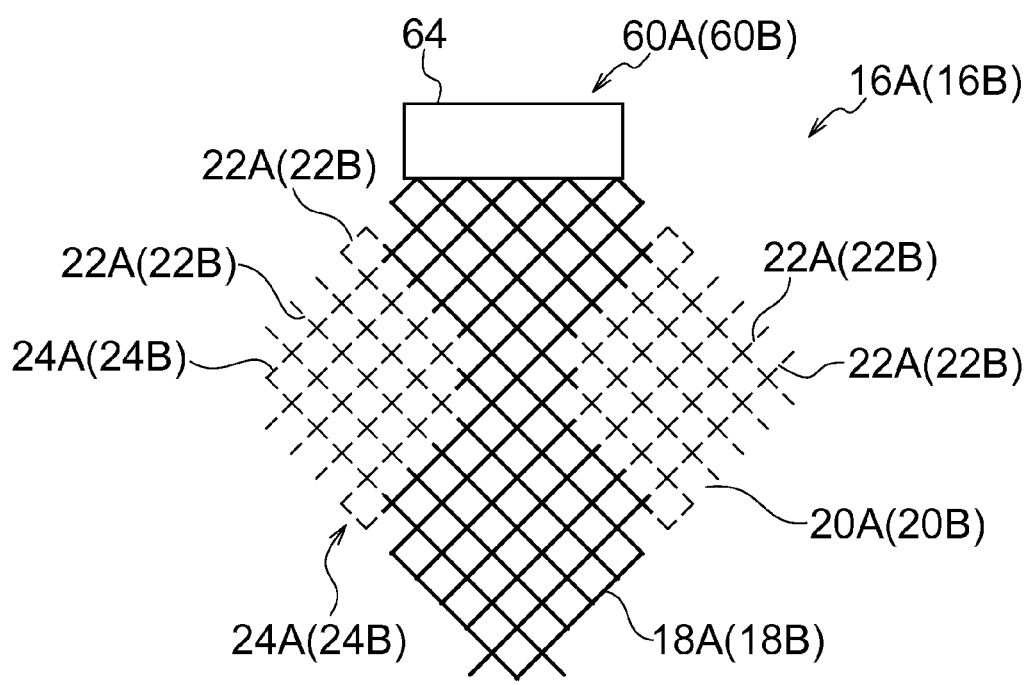
FIG. 1 is a plan view illustrating one example of an electrode terminal of an electroconductive sheet for a touch panel.
Figure 2:
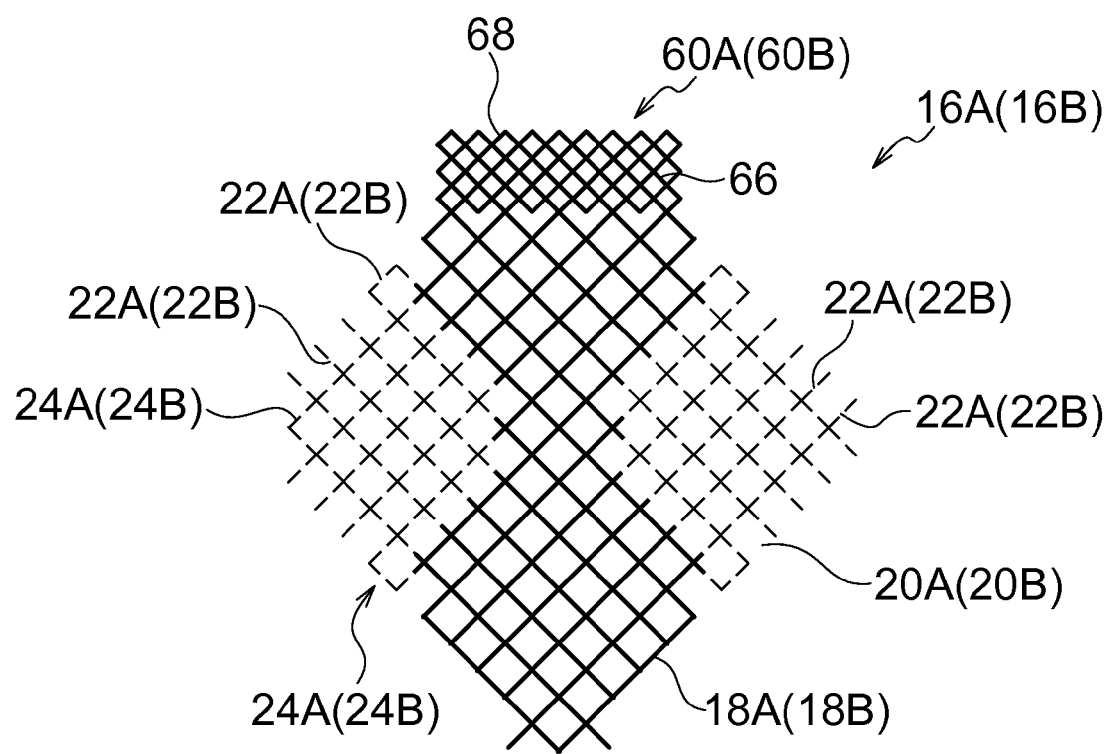
FIG. 2 is a plan view illustrating another example of the electrode terminal of the electroconductive sheet for a touch panel.
Figure 3:
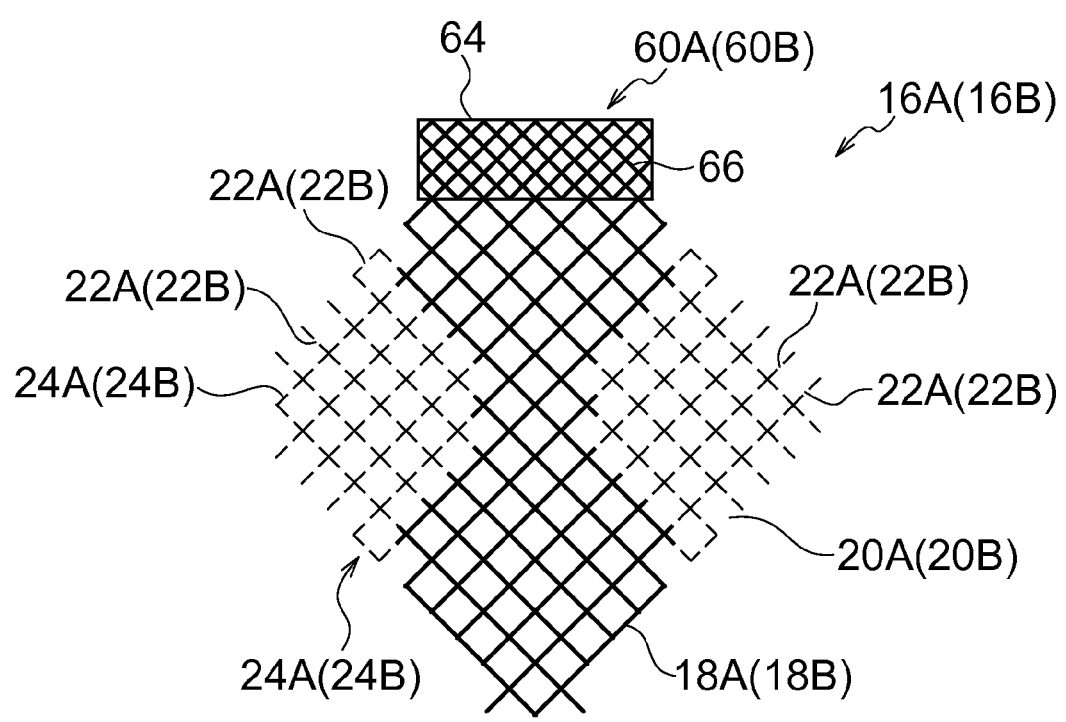
FIG. 3 is a plan view illustrating another example of the electrode terminal of the electroconductive sheet for a touch panel.

As is illustrated in FIG. 1 to FIG. 3, a first electroconductive sheet 10 for a touch panel according to the present embodiment is an electroconductive sheet 12A (12B) which has, on a substrate 14A, an electrode pattern 16A (16B) constructed of a metal thin wire and an electrode terminal 60A (60B) that is electrically connected to an end of the electrode pattern 16A (16B), wherein a transmittance of the electrode pattern 16A (16B) is 83% or more, and when the transmittance of the electrode pattern 16A (16B) is represented by a %, a transmittance of the electrode terminal 60A (60B) is (a-20)% or more and (a-3)% or less. In addition, as another aspect, the first electroconductive sheet 10 for a touch panel according to the present embodiment is an electroconductive sheet 12A (12B) which has, on a substrate 14A, an electrode pattern 16A (16B) constructed of a metal thin wire and an electrode terminal 60A (60B) that is electrically connected to an end of the electrode pattern 16A (16B), wherein an aperture ratio of the electrode pattern 16A (16B) is 90% or more, and when the aperture ratio of the electrode pattern 16A (16B) is represented by b %, an aperture ratio of the electrode terminal 60A (60B) is (b-20)% or more and (b-0.1)% or less.

As is illustrated in FIG. 1 and FIG. 2, a second electroconductive sheet 10 for a touch panel according to the present embodiment is an electroconductive sheet 12A (12B) which has an electrode pattern 16A (16B) constructed of a metal thin wire and an electrode terminal 60A (60B) that is electrically connected to an end of the electrode pattern 16A (16B), wherein the electrode terminal 60A (60B) includes a frame shape 64 constructed of a metal thin wire.

As is illustrated in FIG. 1 and FIG. 2, a third electroconductive sheet 10 for a touch panel according to the present embodiment is an electroconductive sheet 12A (12B) which has an electrode pattern 16A (16B) constructed of a metal thin wire and an electrode terminal 60A (60B) that is electrically connected to an end of the electrode pattern 16A (16B), wherein the electrode terminal 60A (60B) includes a mesh shape 66 formed of lattices 68 constructed of a metal thin wire.

Figure 4A:
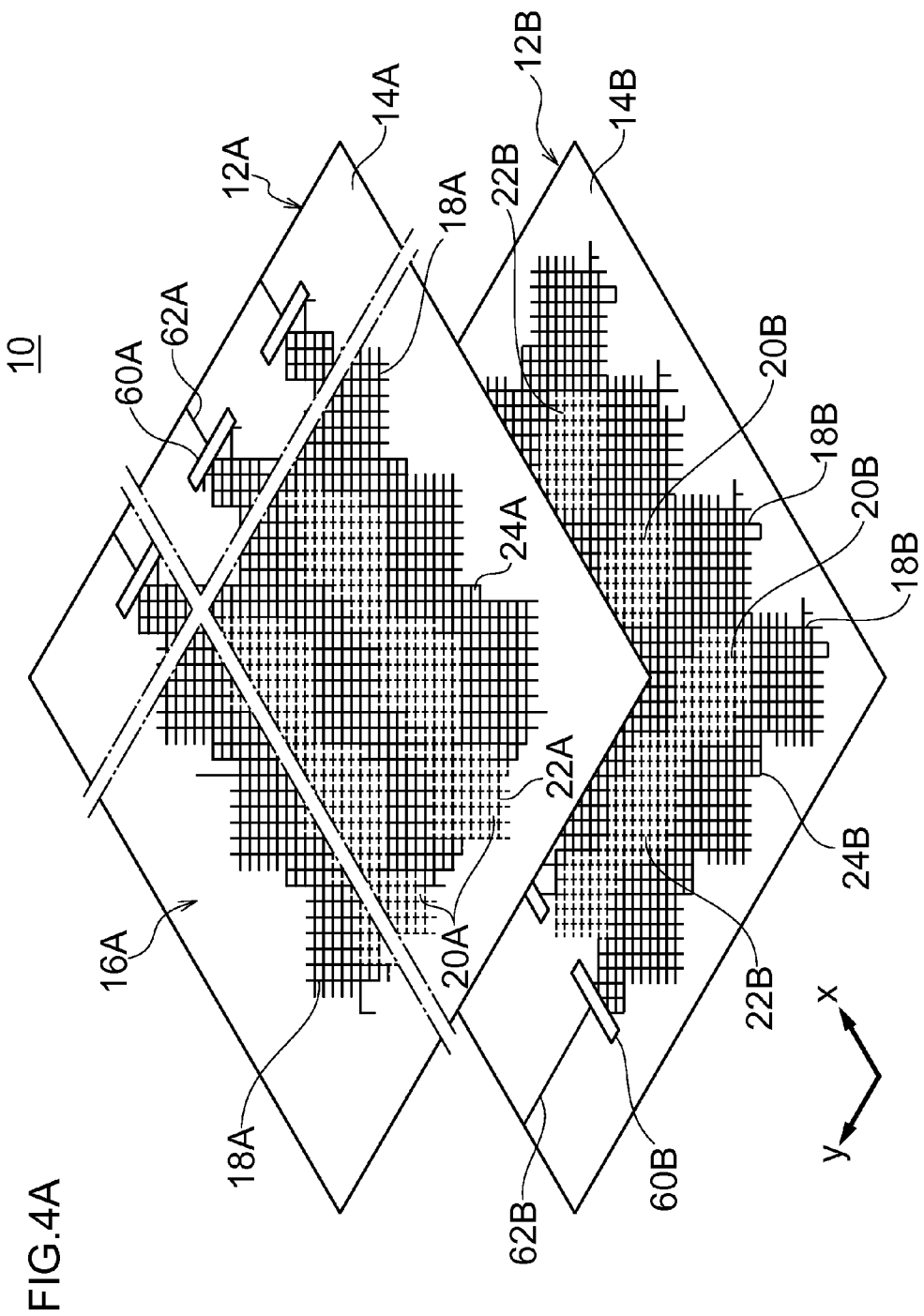
FIG. 4A is an exploded perspective view illustrating the electroconductive sheet for a touch panel, while omitting a part thereof (Part 1).
Figure 4B:
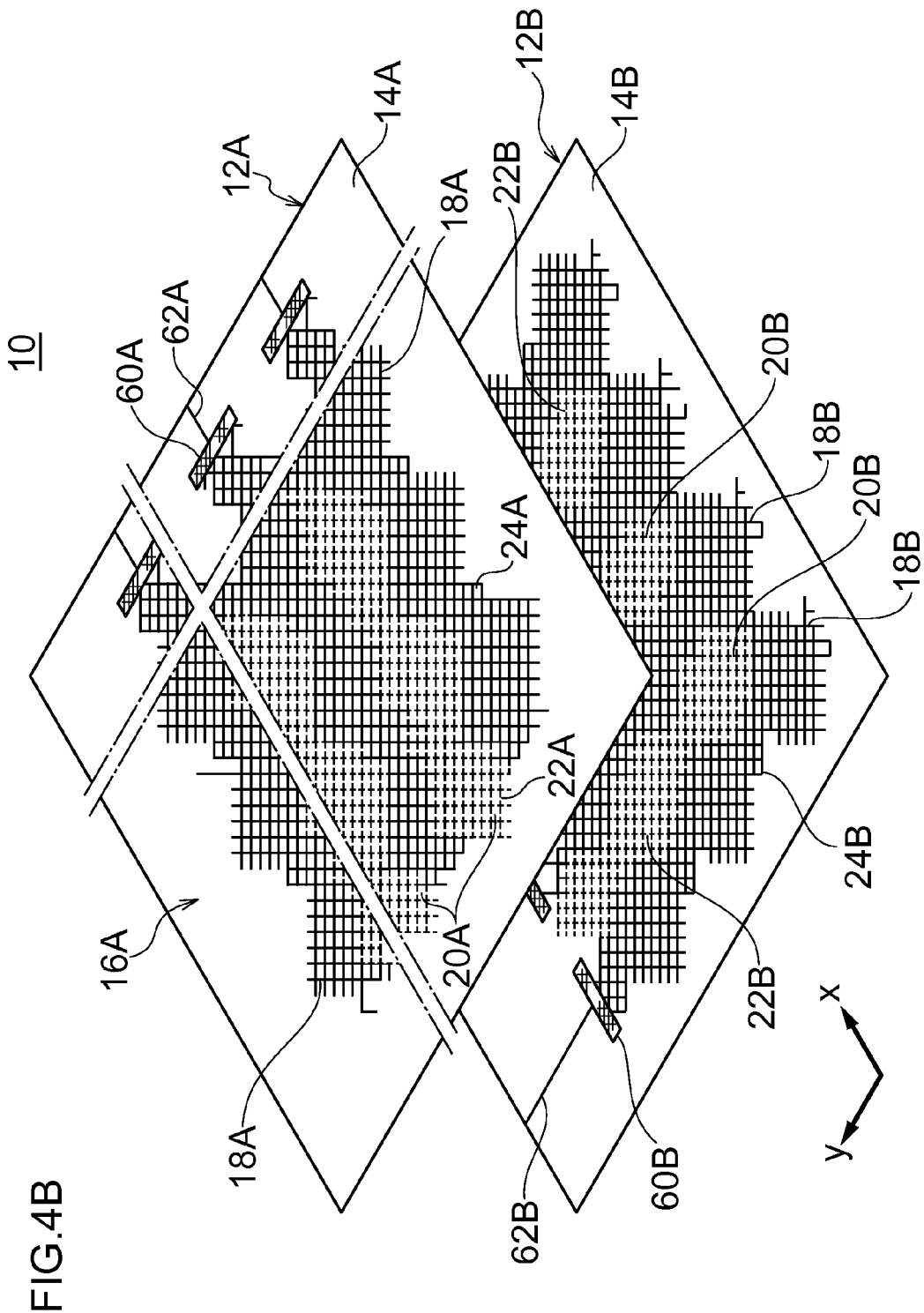
FIG. 4B is an exploded perspective view illustrating the electroconductive sheet for a touch panel, while omitting a part thereof (Part 2).
Figure 5A:
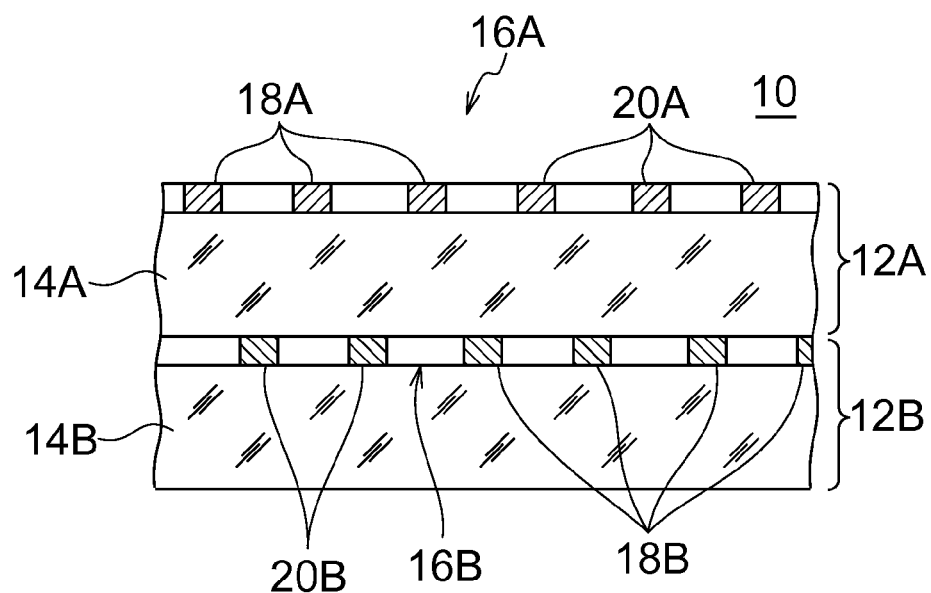
FIG. 5A is a sectional view illustrating one example of the electroconductive sheet for a touch panel, while omitting a part thereof.

In addition, the electroconductive sheet 10 for a touch panel according to the present embodiment is configured by stacking (laminating) a first electroconductive sheet 12A and a second electroconductive sheet 12B, as is illustrated FIG. 4A or FIG. 4B and FIG. 5A.

Figure 6A:
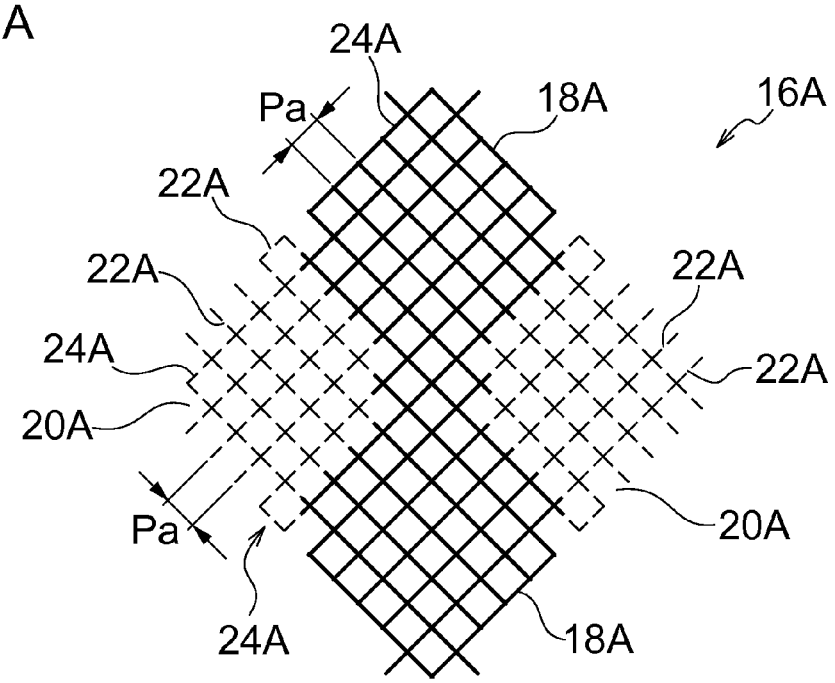
FIG. 6A is a plan view illustrating an example of a first electrode pattern formed on a first electroconductive sheet.

The first electroconductive sheet 12A has a first electrode pattern 16A formed on one principal surface of a first transparent substrate 14A (see FIG. 5A), as is illustrated in FIG. 4A, FIG. 4B and FIG. 6A. The first electrode pattern 16A is constructed of a large number of lattices formed of a metal thin wire. The first electrode pattern 16A has two or more first electroconductive patterns 18A which extend each in a first direction (x-direction) and are arrayed in a second direction (y-direction) perpendicular to the first direction, and first non-electroconductive patterns 20A which electrically separate each of the first electroconductive patterns 18A. In the first non-electroconductive pattern 20A, a plurality of break portions 22A are formed in places other than intersections of the metal thin wires. Each of the first electroconductive patterns 18A is electrically separated by the plurality of break portions 22A.

The metal thin wire which constitutes the first electrode pattern 16A has a line width of 30 µm or less, preferably of 15 µm or less, further preferably of 10 µm or less, further preferably of 9 µm or less, and further preferably of 7 µm or less. A lower limit of the line width is preferably 1 µm. Incidentally, the first electroconductive pattern 18A and the first non-electroconductive pattern 20A have substantially the same line width, but in FIG. 6A, in order to clarify the first electroconductive pattern 18A and the first non-electroconductive pattern 20A, the patterns are exaggeratedly illustrated so that the line width of the first electroconductive pattern 18A is thick and the line width of the first non-electroconductive pattern 20A is thin. The line width of the first electroconductive pattern 18A and the line width of the first non-electroconductive pattern 20A may be the same or may be different. The line widths of both the patterns are preferably the same. The reason is because when the line widths are different, visibility is occasionally aggravated. The metal thin wire of the first electrode pattern 16A is made from an electroconductive material of a metal material such as gold, silver and copper, and a metal oxide, and is made from an opaque electroconductive material.

The first electrode pattern 16A includes a plurality of lattices 24A which are constructed of intersecting metal thin wires. The lattice 24A includes an opening region which is surrounded by the metal thin wire. The lattices 24A have a lattice pitch Pa of 300 µm or more and 800 µm or less, and preferably of 400 µm or more and 600 µm or less. The lattices 24A of the first electroconductive pattern 18A and the lattices 24A of the first non-electroconductive pattern 20A have substantially the same size.

The lattice 24A of the first non-electroconductive pattern 20A has break portions 22A in places other than intersections of the metal thin wires. All of the lattices 24A which constitute the first non-electroconductive pattern 20A do not need to have the break portion 22A as long as the first non-electroconductive pattern 20A may achieve electrical isolation between the adjacent first electroconductive patterns 18A. The length of the break portion 22A is preferably 60 µm or less. A lower limit of the length of the break portion 22A is preferably 10 µm, more preferably is 15 µm, and further preferably is 20 µm. An upper limit of the length of the break portion 22A is preferably 50 µm, more preferably is 40 µm, and further preferably is 30 µm. The preferable range is 10 µm or more and 50 µm or less, and is 15 µm or more and 30 µm or less. In addition, a range where the break portion 22A is formed can be expressed, for instance, by a dispersion of line density. Here, the dispersion of the line density is a dispersion of the total thin wire length in a unit small lattice, and can be defined as ±(maximum value of total wire length−minimum value of total wire length)/average value of total wire length/ 2(%). The dispersion of the line density in the range where the break portion 22A is formed is preferably ±15%, and more preferably is ±10%.

In the above described electroconductive sheet 10 for a touch panel, the lattice 24A has an approximately rhombic shape. Here, the approximately rhombic shape means a parallelogram of which the diagonal lines are substantially perpendicular to each other. However, the shape may also be a polygonal shape, in addition to the approximately rhombic shape. In addition, the shape of one side may also be a curved shape or an arc shape in addition to a linear shape. When the shape is formed into the arc shape, two facing sides may be formed into such an arc shape as to be outwardly convex, and the other facing sides may be formed into such an arc shape as to be inwardly convex, for instance. In addition, the shape of each side may be such a wavy line shape that the outwardly convex arc shape and the inwardly convex arc shape continue. Of course, the shape of each side may be a sinusoidal curve.

Each of the first electroconductive patterns 18A has a wide portion and a narrow portion which are alternately arranged in the first direction (x-direction), and forms a so-called diamond pattern. Similarly, each of the first non-electroconductive patterns 20A has a wide portion and a narrow portion which are alternately arranged in the first direction (x-direction). An order of the wide portion and the narrow portion in the first electroconductive pattern 18A becomes reverse to the order of the wide portion and the narrow portion in the first non-electroconductive pattern 20A. Incidentally, each of the first electroconductive patterns 18A is not limited to the above described diamond pattern, but may be a belt shape (stripe shape) having a predetermined width, a zigzag shape having a predetermined width, or the like. Patterning includes an electrode shape which is formed in an existing ITO transparent electroconductive film.

One end of each of the first electroconductive patterns 18A is electrically connected to a first external wire 62A through a first electrode terminal 60A. On the other hand, the other end of each of the first electroconductive patterns 18A is an open end. Incidentally, the other end of each of the first electroconductive patterns 18A may be formed into a shape having a pattern shape and a terminal, which are similar to those of the one end, except that the other end is not electrically connected to the external wire.

Figure 6B:
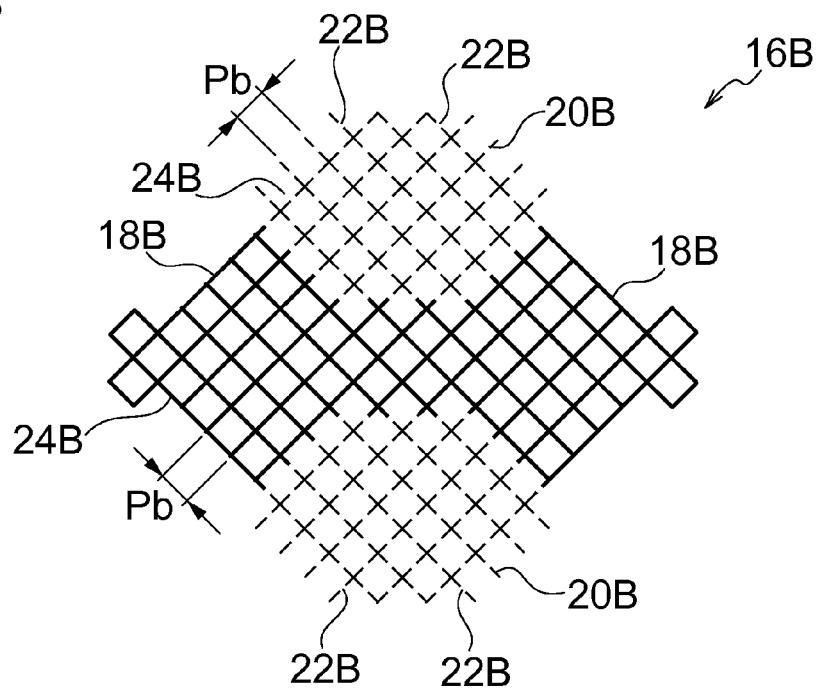
FIG. 6B is a plan view illustrating an example of a second electrode pattern formed on a second electroconductive sheet.

The second electroconductive sheet 12B has a second electrode pattern 16B formed on one principal surface of a second transparent substrate 14B (see FIG. 5A), as is illustrated in FIG. 4A, FIG. 4B and FIG. 6B. The second electrode pattern 16B is constructed of a large number of lattices formed of a metal thin wire. The second electrode pattern 16B has two or more second electroconductive patterns 18B which extend each in the second direction (y-direction) and are arrayed in the first direction (x-direction) perpendicular to the second direction, and second non-electroconductive patterns 20B which electrically separate each of the second electroconductive patterns 18B. In the second non-electroconductive pattern 20B, a plurality of break portions 22B are formed in places other than intersections of the metal thin wires. Each of the second electroconductive patterns 18B is electrically separated by the plurality of break portions 22B.

The metal thin wire which constitutes the second electrode pattern 16B has substantially the same line width as that of the metal thin wire which constitutes the first electrode pattern 16A. Incidentally, the second electroconductive pattern 18B and the second non-electroconductive pattern 20B have substantially the same line width, but in FIG. 6B, in order to clarify the second electroconductive pattern 18B and the second non-electroconductive pattern 20B, the patterns are exaggeratedly illustrated so that the line width of the second electroconductive pattern 18B is thick and the line width of the second non-electroconductive pattern 20B is thin. The line width of the second electroconductive pattern 18B and the line width of the second non-electroconductive pattern 20B may be the same or may be different. The line widths of both the patterns are preferably the same. The reason is because when the line widths are different, visibility is occasionally aggravated.

The metal thin wire of the second electrode pattern 16B is made from the same electroconductive material as that of the metal thin wire of the first electrode pattern 16A.

The second electrode pattern 16B includes a plurality of lattices 24B which are constructed of the intersecting metal thin wires. The lattice 24B includes an opening region which is surrounded by the metal thin wire. The lattice 24B has a lattice pitch Pb of 300 μm or more and 800 μm or less, and preferably of 400 μm or more and 600 μm or less. The lattices 24B of the second electroconductive pattern 18B and the lattices 24B of the second non-electroconductive pattern 20B have substantially the same size.

The lattice 24B of the second non-electroconductive pattern 20B has break portions 22B in places other than intersections of the metal thin wires. All of the lattices 24B which constitute the second non-electroconductive pattern 20B do not need to have the break portion 22B as long as the second non-electroconductive pattern 20B may achieve electrical isolation between the adjacent second electroconductive patterns 18B. The length of the break portion 22B is preferably 60 μm or less. A lower limit of the length of the break portion 22B is preferably 10 μm, more preferably is 15 μm, and further preferably is 20 μm. An upper limit of the length of the break portion 22B is preferably 50 μm, more preferably is 40 μm, and further preferably is 30 μm. A preferable range is 10 μm or more and 50 μm or less, and is 15 μm or more and 30 μm or less. In addition, a range where the break portion 22B is formed can be expressed, for instance, by a dispersion of line density. Here, the dispersion of the line density is a dispersion of the total thin wire length in a unit small lattice, and can be defined as ±(maximum value of total wire length−minimum value of total wire length)/average value of total wire length/2(%). The dispersion of the line density in the range where the break portion 22B is formed is preferably ±15%, and more preferably is ±10%.

In the above described electroconductive sheet 10 for a touch panel, the lattice 24B has an approximately rhombic shape. Here, the approximately rhombic shape means a parallelogram of which the diagonal lines are substantially perpendicular to each other. However, the shape may also be a polygonal shape, in addition to the approximately rhombic shape. In addition, the shape of one side may also be a curved shape or an arc shape, in addition to a linear shape. When the shape of the side is formed into the arc shape, two facing sides may be formed into such an arc shape as to be outwardly convex, and the other facing sides may be formed into such an arc shape as to be inwardly convex, for instance. In addition, the shape of each side may be such a wavy line shape that the outwardly convex arc shape and the inwardly convex arc shape continue. Of course, the shape of each side may be a sinusoidal curve.

Each of the second electroconductive patterns 18B has a wide portion and a narrow portion which are alternately arranged in the second direction (y-direction). Similarly, each of the second non-electroconductive patterns 20B has a wide portion and a narrow portion which are alternately arranged in the second direction (y-direction). An order of the wide portion and the narrow portion in the second electroconductive pattern 18B becomes reverse to the order of the wide portion and the narrow portion in the second non-electroconductive pattern 20B.

One end of each of the second electroconductive patterns 18B is electrically connected to a second external wire 62B through a second electrode terminal 60B. On the other hand, the other end of each of the second electroconductive patterns 18B is an open end.

Figure 7:
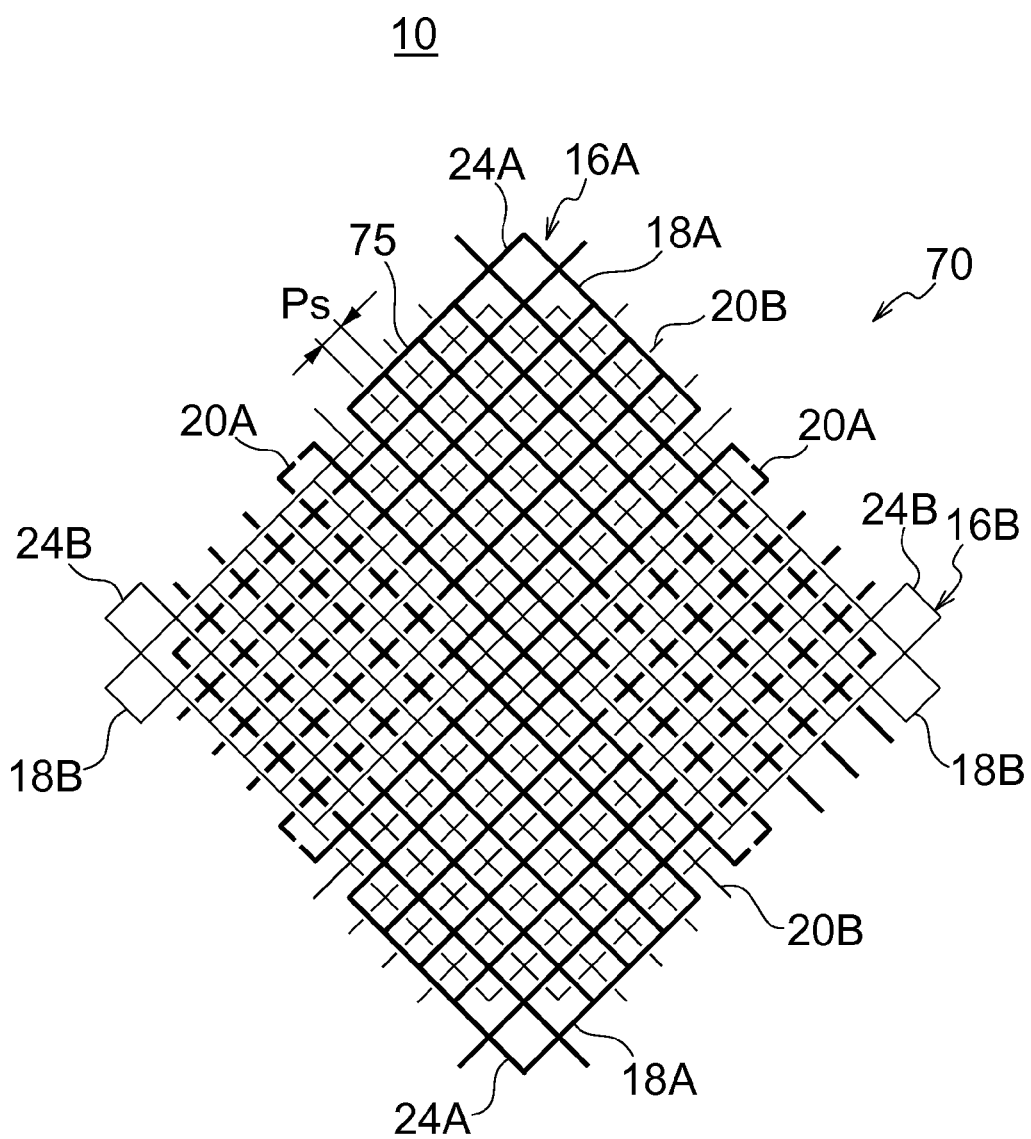
FIG. 7 is a plan view illustrating an example of the electroconductive sheet for a touch panel, which is formed of the first electroconductive sheet and the second electroconductive sheet in combination, while omitting a part thereof.

In addition, when the first electroconductive sheet 12A is stacked on the second electroconductive sheet 12B to form the electroconductive sheet 10 for a touch panel, for instance, as is illustrated in FIG. 7, the first electrode pattern 16A is arranged so as not to overlap with the second electrode pattern 16B. At this time, the first electrode pattern 16A and the second electrode pattern 16B are arranged so that the narrow portions of the first electroconductive pattern 18A face the narrow portions of the second electroconductive pattern 18B, and the narrow portions of the first electroconductive pattern 18A intersects with the narrow portions of the second electroconductive pattern 18B. As a result, a combination pattern 70 is formed by the first electrode pattern 16A and the second electrode pattern 16B. Incidentally, each of the line widths of the first electrode pattern 16A and the second electrode pattern 16B is substantially the same as the other. In addition, each of the sizes of the lattices 24A and the lattices 24B is substantially the same as the other. However, in FIG. 6A and FIG. 6B, in order to clarify a positional relationship between the first electrode pattern 16A and the second electrode pattern 16B, the line width of the first electrode pattern 16A is illustrated so as to be thicker than the line width of the second electrode pattern 16B.

In the combination pattern 70, small lattices are formed by the lattices 24A and the lattices 24B when viewed from a top surface. Specifically, the intersections of the lattices 24A are arranged in the opening regions of the lattices 24B. Incidentally, the small lattices have a lattice pitch Ps of 150 μm or more and 400 μm or less, which is a half of the lattice pitches Pa and Pb of the lattices 24A and the lattices 24B, and preferably of 200 μm or more and 300 μm or less.

The break portions 22A of the first non-electroconductive pattern 20A are formed in places other than the intersections of the lattices 24A, and the break portions 22B of the second non-electroconductive pattern 20B are formed in places other than the intersections of the lattices 24B. As a result, in the combination pattern 70, the deterioration of the visibility, which originates in the break portion 22A and the break portion 22B, can be prevented.

The metal thin wire of the second electroconductive pattern 18B is arranged particularly at a position facing the break portions 22A. In addition, the metal thin wire of the first electroconductive pattern 18A is arranged at a position facing the break portions 22B. As a result, the metal thin wire of the second electroconductive pattern 18B masks the break portions 22A and the metal thin wire of the first electroconductive pattern 18A masks the break portions 22B. Accordingly, in the combination pattern 70, the break portions 22A and the break portions 22B become hard to be recognized when viewed from a top surface, and the visibility can be enhanced. When enhancement of visibility is considered, the length of the break portions 22A and the line width of the metal thin wire of the second electroconductive pattern 18B preferably satisfy the relational expression of: line width×1<break portion<line width×10. Similarly, the length of the break portions 22B and the line width of the metal thin wire of the first electroconductive pattern 18A preferably satisfy the relational expression of: line width×1<break portion<line width×10.

When this electroconductive sheet 10 for a touch panel is used as a touch panel, a protective layer (not-shown) is formed on the first electroconductive sheet 12A. The first external wires 62A which have been derived from a large number of the respective first electroconductive patterns 18A of the first electroconductive sheet 12A, and the second external wires 62B which have been derived from a large number of the respective second electroconductive patterns 18B of the second electroconductive sheet 12B are connected, for instance, to an IC circuit which controls scanning.

In order to minimize the area in an outer peripheral region outside a display screen of a liquid crystal display device, out of the electroconductive sheet 10 for a touch panel, it is preferable that each connecting portion between the first electroconductive pattern 18A and the first external wire 62A be linearly arrayed, and each connecting portion between the second electroconductive pattern 18B and the second external wire 62B be linearly arrayed.

When a finger comes in contact with the protective layer, a capacitance between the first electroconductive pattern 18A and the second electroconductive pattern 18B which face the finger changes. The IC circuit detects the amount of this change, and calculates a position of the finger based on the amount of this change. This calculation is performed between the respective first electroconductive patterns 18A and the respective second electroconductive patterns 18B. Accordingly, even when two or more fingers simultaneously come in contact with the protective layer, the positions of each of the fingers can be detected.

Thus, when the electroconductive sheet 10 for a touch panel is used for application, for instance, to a projected capacitive touch panel, a response speed can be increased because a surface resistance is small in the electroconductive sheet 10 for a touch panel, and the trend of increasing the size of the touch panel can be promoted.

However, in a touch panel in which a conventional metal thin wire is used for electrodes, thick terminals (solid terminals) are used as the electrode terminals 60A and 60B so as to provide high electroconductivity. Accordingly, when a display and the touch panel are operated in combination, the electrode terminals shield light emitted from the display in a sensing region (electrode pattern) of the touch panel. Thus, a darkened portion appears in a vicinity of the electrode terminals in the sensing region, and the display in that portion occasionally becomes less-viewable.

Thus, the present invention has achieved the first to third electroconductive sheets for a touch panel, which are described below.

(First Electroconductive Sheet for Touch Panel)

A first electroconductive sheet for a touch panel according the present invention is the above described electroconductive sheet 12A (12B) which has, on a substrate 14A, an electrode pattern 16A (16B) constructed of a metal thin wire and an electrode terminal 60A (60B) that is electrically connected to an end of the electrode pattern 16A (16B), wherein the electrode pattern 16A (16B) is configured to have a transmittance of 83% or more, and when a transmittance of the electrode pattern 16A (16B) is represented by a %, the electrode terminal 60A (60B) is configured to have a transmittance of (a-20)% or more and (a-3)% or less. In addition, more preferably, the transmittance of the electrode terminal 60A (60B) is in a range of (a-15)% or more and (a-3)% or less, further preferably of (a-10) or more and (a-3) or less, and most preferably of (a-5) or more and (a-3) or less.

In addition, the first electroconductive sheet for a touch panel of another aspect according the present invention is the above described electroconductive sheet 12A (12B) which has, on the substrate 14A, an electrode pattern 16A (16B) constructed of the metal thin wire and an electrode terminal 60A (60B) that is electrically connected to an end of the electrode pattern 16A (16B), wherein the electrode pattern 16A (16B) is configured to have an aperture ratio of 90% or more, and when the aperture ratio of the electrode pattern 16A (16B) is represented by b %, the electrode terminal 60A (60B) is configured to have an aperture ratio of (b-20)% or more and (b-0.1)% or less. In addition, more preferably, the aperture ratio is in a range of (b-10) or more and (b-0.3) or less, and further preferably of (b-5) or more and (b-0.3) or less.

FIG. 1 illustrates an example in which the electrode terminal 60A (60B) has a frame shape 64 constructed of a metal thin wire. Here, when a line width of the thin wire of the electrode pattern 16A (16B) is represented by A (μm), a line width B (μm) of the frame shape of the electrode terminal 60A (60B) preferably satisfies B≥2A or B≥A+5 (μm). The line width a (μm) of the thin wire of the above described electrode pattern is preferably 30 μm or less.

As is illustrated in FIG. 1, the electrode terminal 60A (60B) is structured so as to have the frame shape 64 constructed of the metal thin wire, thereby a transmittance of the electrode pattern 16A (16B) can be made to be 83% or more, and when the transmittance of the electrode pattern 16A (16B) is represented by a %, a transmittance of the electrode terminal 60A (60B) can be made to be (a-20)% or more and (a-3)% or less.

In addition, when the electrode terminal 60A (60B) is structured so as to have the frame shape 64 constructed of the metal thin wire, an aperture ratio of the electrode pattern 16A (16B) can be made to be 90% or more, and when the aperture ratio of the electrode pattern 16A (16B) is represented by b %, an aperture ratio of the electrode terminal 60A (60B) can be made to be (b-20)% or more and (b-0.1)% or less.

Accordingly, when the electrode terminal 60A (60B) is structured so as to be the frame shape 64 constructed of the metal thin wire, the electrode terminal becomes hard to shield light emitted from the display in the sensing region (electrode pattern) of the touch panel, which is different from the conventional thick terminal (solid terminal). Thus, a darkened portion does not appear in the vicinity of the electrode terminal in the sensing region. Accordingly, visibility is not impaired in the vicinity of the electrode terminal in the sensing region.

FIG. 2 illustrates an example in which the electrode terminal 60A (60B) has a mesh shape 66 formed of lattices 68 constructed of a metal thin wire. Here, a pitch of the mesh shape 66 of the electrode terminal 60A (60B) is preferably denser than the pitch of the electrode pattern 16A (16B), more preferably is not larger than ¾ of the pitch of the electrode pattern 16A (16B), further preferably is not larger than ⅔ thereof, and still further preferably is ½ thereof. When the pitch having the mesh shape of the electrode terminal is made smaller than that of the electrode pattern, electric characteristics of the electrode terminal can be enhanced and the stability of signal detection can be maintained. The specific pitch of the mesh shape 66 of the electrode terminal 60A (60B) is 50 μm or more and 300 μm or less, and more preferably is 50 μm or more and 250 μm or less. Incidentally, the pitch of the electrode pattern 16A (16B) is a value approximately equal to the length of one side of the lattice 24A (24B).

As is illustrated in FIG. 2, the electrode terminal 60A (60B) is structured so as to have a mesh shape 66 formed of the lattices 68 constructed of the metal thin wire, thereby a transmittance of the electrode pattern 16A (16B) can be made to be 83% or more, and when the transmittance of the electrode pattern 16A (16B) is represented by a %, a transmittance of the electrode terminal 60A (60B) can be made to be (a-20)% or more and (a-3)% or less.

In addition, when the electrode terminal 60A (60B) is structured so as to have the mesh shape 66 formed of the lattices 68 constructed of the metal thin wire, an aperture ratio of the electrode pattern 16A (16B) can be made to be 90% or more, and when the aperture ratio of the electrode pattern 16A (16B) is represented by b %, an aperture ratio of the electrode terminal 60A (60B) can be made to be (b-20)% or more and (b-0.1)% or less.

Accordingly, when the electrode terminal 60A (60B) is structured so as to have the mesh shape 66 constructed of the metal thin wire, the electrode terminal resists shielding light emitted from the display in the sensing region (electrode pattern) of the touch panel, and accordingly a darkened portion does not appear in the vicinity of the electrode terminal in the sensing region, which is different from the conventional thick terminal (solid terminal). Accordingly, visibility is not impaired in the vicinity of the electrode terminal in the sensing region.

FIG. 3 illustrates an example in which the electrode terminal 60A (60B) is formed of: the frame shape 64 constructed of the metal thin wire; and the mesh shape 66 formed of the lattices 68 constructed of the metal thin wire.

As is illustrated in FIG. 3, the electrode terminal 60A (60B) is formed of: the frame shape 64 constructed of the metal thin wire; and the mesh shape 66 formed of the lattices 68 constructed of the metal thin wire, thereby a transmittance of the electrode pattern 16A (16B) can be made to be 83% or more, and when the transmittance of the electrode pattern 16A (16B) is represented by a %, the transmittance of the electrode terminal 60A (60B) can be made to be (a-20)% or more and (a-3)% or less.

In addition, when the electrode terminal 60A (60B) is formed of: the frame shape 64 constructed of the metal thin wire; and the mesh shape 66 formed of the lattices 68 constructed of the metal thin wire, an aperture ratio of the electrode pattern 16A (16B) can be made to be 90% or more, and when the aperture ratio of the electrode pattern 16A (16B) is represented by b %, an aperture ratio of the electrode terminal 60A (60B) can be made to be (b-20)% or more and (b-0.1)% or less.

Accordingly, when the electrode terminal 60A (60B) is formed of: the frame shape 64 constructed of the metal thin wire; and the mesh shape 66 formed of the lattices 68 constructed of the metal thin wire, the electrode terminal resists shielding light emitted from the display in a sensing region (electrode pattern) of the touch panel, and accordingly a darkened portion does not appear in the vicinity of the electrode terminal in the sensing region, which is different from the conventional thick terminal (solid terminal). Accordingly, visibility is not impaired in the vicinity of the electrode terminal in the sensing region.

Incidentally, in the mesh shape 66 in FIG. 2 and FIG. 3, the lattice 68 has an approximately rhombic shape. Here, the approximately rhombic shape means a parallelogram of which the diagonal lines are substantially perpendicular to each other. However, the shape may also be a polygonal shape, in addition to the approximately rhombic shape. In addition, the shape of one side may also be a curved shape or an arc shape, in addition to a linear shape. When the shape is formed into the arc shape, two facing sides may be formed into such an arc shape as to be outwardly convex, and the other facing sides may be formed into such an arc shape as to be inwardly convex, for instance. In addition, the shape of each side may be such a wavy line shape that the outwardly convex arc shape and the inwardly convex arc shape continue. Of course, the shape of each side may be a sinusoidal curve.

In the electrode terminal 60A (60B) according to the present invention, a resistance between a portion which is electrically connected to the electrode pattern and the external wire 62A (62B) is preferably in a range of 1 to 100Ω. In addition, when the electrode terminal 60A (60B) includes the mesh shape 66 as is illustrated in FIG. 2 and FIG. 3, a surface resistance value of the electrode terminal 60A (60B) is preferably in a range of 4 Ω/sq. or more and 80 Ω/sq. or less, and further preferably is in a range of 10 Ω/sq. or more and 40 Ω/sq. or less.

Incidentally, the aperture ratio is a ratio of a translucent portion except for the metal thin wire occupying in the whole in the electrode terminal 60A (60B). For instance, an aperture ratio of the lattice 68 is 90%, the lattice 68 which has a square shape with a line width of 15 μm and a pitch of 300 μm.

(Second Electroconductive Sheet for Touch Panel)

A second electroconductive sheet for a touch panel according the present invention is the above described electroconductive sheet 12A (12B) which has, on a substrate 14A, an electrode pattern 16A (16B) constructed of a metal thin wire and an electrode terminal 60A (60B) that is electrically connected to an end of the electrode pattern 16A (16B), wherein the electrode terminal 60A (60B) is configured to include a frame shape 64 constructed of a metal thin wire.

FIG. 1 illustrates an example in which the electrode terminal 60A (60B) is a frame shape 64 constructed of a metal thin wire.

Here, when a line width of the thin wire of the electrode pattern 16A (16B) is represented by A (μm), a line width B (μm) of the frame shape of the electrode terminal 60A (60B) preferably satisfies B≥2A or B≥A+5 (μm). The line width B (μm) of the frame shape is in a range, more preferably, of 50 μm≥B≥10 μm, and further preferably of 30 μm≥B≥15 μm. In addition, the frame shape 64 is approximately a rectangular shape, and the breadth is approximately the same length as the maximum breadth of the electrode pattern, but may also be smaller than the maximum breadth of the electrode pattern. Incidentally, when the breadth is extremely smaller than the maximum breadth of the electrode pattern, an electric resistance increases. Accordingly, the breadth is preferably not smaller than ⅓ of the maximum breadth of the electrode pattern, and more preferably is not smaller than ½ thereof.

As is illustrated in FIG. 1, the electrode terminal 60A (60B) is structured so as to be the frame shape 64 constructed of the metal thin wire, thereby the electrode terminal resists shielding light emitted from the display in the sensing region (electrode pattern) of the touch panel, and accordingly a darkened portion does not appear in the vicinity of the electrode terminal in the sensing region, which is different from the conventional thick terminal (solid terminal). Accordingly, visibility is not impaired in the vicinity of the electrode terminal in the sensing region. In addition, when such a shape is adopted, there are also such effects that an amount of components to be used can be reduced without increasing a noise of an electric signal, and a production cost of an electroconductive film can be reduced.

FIG. 3 illustrates an example in which the electrode terminal 60A (60B) is formed of: the frame shape 64 constructed of the metal thin wire; and the mesh shape 66 formed of the lattices 68 constructed of the metal thin wire. Here, the pitch of the mesh shape 66 of the electrode terminal 60A (60B) is preferably denser than the pitch of the electrode pattern 16A (16B), more preferably is not larger than ¾ of the pitch of the electrode pattern 16A (16B), further preferably is not larger than ⅔ thereof, and still further preferably is ½ thereof. When the pitch having the mesh shape of the electrode terminal is made smaller than that of the electrode pattern, electric characteristics of the electrode terminal can be enhanced and the stability of signal detection can be maintained. The specific pitch of the mesh shape 66 of the electrode terminal 60A

(60B) is 50 μm or more and 300 μm or less, and more preferably is 50 μm or more and 250 μm or less. Incidentally, the pitch of the electrode pattern 16A (16B) is a value approximately equal to the length of one side of the lattice 24A (24B).

As is illustrated in FIG. 3, the electrode terminal 60A (60B) is formed of: the frame shape 64 constructed of the metal thin wire; and the mesh shape 66 formed of the lattices 68 constructed of the metal thin wire, thereby the electrode terminal resists shielding light emitted from the display in a sensing region (electrode pattern) of the touch panel, and accordingly a darkened portion does not appear in the vicinity of the electrode terminal in the sensing region, which is different from the conventional thick terminal (solid terminal). Accordingly, visibility is not impaired in the vicinity of the electrode terminal in the sensing region.

Incidentally, in the mesh shape 66 in FIG. 3, the lattice 68 has an approximately rhombic shape. Here, the approximately rhombic shape means a parallelogram of which the diagonal lines are substantially perpendicular to each other. However, the shape may also be a polygonal shape, in addition to the approximately rhombic shape. In addition, the shape of one side may also be a curved shape or an arc shape, in addition to a linear shape. When the shape is formed into the arc shape, two facing sides may be formed into such an arc shape as to be outwardly convex, and the other facing sides may be formed into such an arc shape as to be inwardly convex, for instance. In addition, the shape of each side may be such a wavy line shape that the outwardly convex arc shape and the inwardly convex arc shape continue. Of course, the shape of each side may be a sinusoidal curve.

In the electrode terminal 60A (60B) according to the present invention, a resistance between a portion which is electrically connected to the electrode pattern and the external wire 62A (62B) is preferably in a range of 1 to 100Ω. In addition, when the electrode terminal 60A (60B) includes the mesh shape 66 as is illustrated in FIG. 3, a surface resistance value of the electrode terminal 60A (60B) is preferably in a range of 4 Ω/sq. or more and 80 Ω/sq. or less, and further preferably is in a range of 10 Ω/sq. or more and 40 Ω/sq. or less.

Incidentally, the aperture ratio is a ratio of a translucent portion except for the metal thin wire occupying in the whole in the electrode terminal 60A (60B), and for instance, an aperture ratio of the lattice 68 is 90%, the lattice 68 which has a square shape with a line width of 15 μm and a pitch of 300 μm.

In addition, in the present invention, in the case of FIG. 3, it is preferable that a transmittance of the electrode pattern 16A (16B) be 83% or more, and that when the transmittance of the electrode pattern 16A (16B) is represented by a %, a transmittance of the electrode terminal 60A (60B) be (a-20)% or more and (a-3)% or less.

Furthermore, in the present invention, in the case of FIG. 3, it is preferable that an aperture ratio of the electrode pattern 16A (16B) be 90% or more, and that when the aperture ratio of the electrode pattern 16A (16B) is represented by b %, an aperture ratio of the electrode terminal 60A (60B) be (b-20)% or more and (b-0.1)% or less. Incidentally, the aperture ratio here is a ratio of a translucent portion except for the metal thin wire occupying in the whole in the electrode terminal 60A (60B). For instance, an aperture ratio of the lattice 68 is 90%, the lattice 68 which has a square shape with a line width of 15 μm and a pitch of 300 μm.

(Third Electroconductive Sheet for Touch Panel)

A third electroconductive sheet for a touch panel according the present invention is the above described electroconductive sheet 12A (12B) which has, on a substrate 14A, an electrode pattern 16A (16B) constructed of a metal thin wire and an electrode terminal 60A (60B) that is electrically connected to an end of the electrode pattern 16A (16B), wherein the electrode terminal 60A (60B) is configured to include a mesh shape 66 formed of lattices 68 constructed of a metal thin wire.

FIG. 2 illustrates an example in which the electrode terminal 60A (60B) is a mesh shape 66 formed of lattices 68 constructed of a metal thin wire.

Here, the pitch of the mesh shape 66 of the electrode terminal 60A (60B) is preferably denser than the pitch of the electrode pattern 16A (16B), more preferably is not larger than ¾ of the pitch of the electrode pattern 16A (16B), further preferably is not larger than ⅔ thereof, and still further preferably is ½ thereof. When the pitch having the mesh shape of the electrode terminal is made smaller than that of the electrode pattern, electric characteristics of the electrode terminal can be enhanced and the stability of signal detection can be maintained. The specific pitch of the mesh shape 66 of the electrode terminal 60A (60B) is 50 μm or more and 300 μm or less, and more preferably is 50 μm or more and 250 μm or less. Incidentally, the pitch of the electrode pattern 16A (16B) is a value approximately equal to the length of one side of the lattice 24A (24B).

As is illustrated in FIG. 3, the electrode terminal 60A (60B) is structured so as to have a mesh shape 66 formed of the lattices 68 constructed of the metal thin wire, thereby the electrode terminal resists shielding light emitted from the display in the sensing region (electrode pattern) of the touch panel, and accordingly a darkened portion does not appear in the vicinity of the electrode terminal in the sensing region, which is different from the conventional thick terminal (solid terminal). Accordingly, visibility is not impaired in the vicinity of the electrode terminal in the sensing region.

FIG. 3 illustrates the electrode terminal 60A (60B) that has the mesh shape 66 formed of the lattices 68 constructed of the metal thin wire illustrated in FIG. 2, further has a frame shape 64 constructed of a metal thin wire provided on an outer frame of the mesh shape 66 formed of the lattices 68 of the electrode terminal. Specifically, FIG. 3 illustrates the electrode terminal 60A (60B) which is formed of: the frame shape 64 constructed of the metal thin wire; and the mesh shape 66 formed of the lattices 68 constructed of the metal thin wire.

Here, when a line width of a thin wire of the electrode pattern 16A (16B) is represented by A (μm), a line width B (μm) of the frame shape 64 of the electrode terminal 60A (60B) preferably satisfies B≥2A or B≥A+5 (μm).

As is illustrated in FIG. 3, the electrode terminal 60A (60B) is formed of: the frame shape 64 constructed of the metal thin wire; and the mesh shape 66 formed of the lattices 68 constructed of the metal thin wire, thereby light can be prevented from being irregularly reflected on the electrode terminal in a sensing region (electrode pattern) of the touch panel, and accordingly a darkened portion can be prevented from appearing in the vicinity of the electrode terminal in the sensing region, which is different from the conventional thick terminal (solid terminal).

Incidentally, in the mesh shape 66 in FIG. 2 and FIG. 3, the lattice 68 has an approximately rhombic shape. Here, the approximately rhombic shape means a parallelogram of which the diagonal lines are substantially perpendicular to each other.

In the electrode terminal 60A (60B) according to the present invention, a resistance between a portion which is electrically connected to the electrode pattern and the external wire 62A (62B) is preferably in a range of 1 to 100 Ω. In addition, in the electrode terminal 60A (60B) as is illustrated in FIG. 2 and FIG. 3, a surface resistance value of the electrode terminal 60A (60B) is preferably in a range of 4 Ω/sq. or more and 80 Ω/sq. or less, and further preferably is in a range of 10 Ω/sq. or more and 40 Ω/sq. or less.

In addition, in the present invention, it is preferable that a transmittance of the electrode pattern 16A (16B) be 83% or more, and that when the transmittance of the electrode pattern 16A (16B) is represented by a %, the transmittance of the electrode terminal 60A (60B) is (a-20)% or more and (a-3)% or less.

Furthermore, in the present invention, it is preferable that an aperture ratio of the electrode pattern 16A (16B) be 90% or more, and that when the aperture ratio of the electrode pattern 16A (16B) is represented by b %, an aperture ratio of the electrode terminal 60A (60B) be (b-20)% or more and (b-0.1)% or less. Incidentally, the aperture ratio here is a ratio of a translucent portion except for the metal thin wire occupying in the whole in the electrode terminal 60A (60B), and for instance, an aperture ratio of the lattice 68 is 90%, the lattice 68 which has a square shape with a line width of 15 μm and a pitch of 300 μm.

As has been described above, the present invention can prevent a portion which becomes dark from appearing in the vicinity of the electrode terminal in the sensing region. Further, as another effect, the present invention also has an effect that the metal thin wire in the vicinity of the electrode terminal in the sensing region can be prevented from resulting in being thicker than an intended line width, when the electroconductive sheet 12A (12B) is produced by a production method using light exposure, which is described below.

Because the conventional electrode terminal is a thick terminal (solid terminal) so as to have high electroconductivity, the portion which becomes the electrode terminal is irradiated with a large quantity of light by light exposure. There have been problems that a line width of an electrode pattern is extremely small and the light is transferred also to a portion which becomes the electrode pattern in the vicinity of the electrode terminal, and the metal thin wire in the vicinity of the electrode terminal becomes thicker than the intended line width.

Specifically, when a transmittance or an aperture ratio of the electrode terminal 60A (60B) is set as in the present invention, it does not occur that the portion which becomes the electrode terminal is irradiated with a large quantity of light by light exposure, and thus, it can be prevented that the metal thin wire in the vicinity of the electrode terminal in the sensing region results in being thicker than the intended line width.

Incidentally, when a user touches and operates with his finger the touch panel in which the electroconductive sheet according to the present invention is used, a response speed is quick and detection sensitivity is excellent. In addition, even when a user touches and operates with his fingers the touch panel at two or more points, similarly, a good result is obtained, and the touch panel can cope with multitouch.

Next, a method for producing a first electroconductive sheet 12A and a second electroconductive sheet 12B is described below.

When the first electroconductive sheet 12A and the second electroconductive sheet 12B are produced, it is acceptable, for instance, to expose photosensitive materials which have layers of an emulsion containing a photosensitive silver halide salt formed on a first transparent substrate 14A and a second transparent substrate 14B to light, to subject the transparent substrates to development treatment, thereby to form a metal silver portion (metal thin wire) and an optically transparent portion (opening region) on an exposed portion and an unexposed portion, and to form a first electrode pattern 16A and a second electrode pattern 16B. Incidentally, it is also acceptable to subject the metal silver portion further to physical development and/or plating treatment, and thereby make the metal silver portion carry an electroconductive metal.

Alternatively, it is acceptable to expose photoresist layers formed on copper foils which have been formed on the first transparent substrate 14A and the second transparent substrate 14B, to light, to subject the layers to development treatment to form resist patterns, to etch the copper foils which are exposed from the resist patterns, and thereby to form the first electrode pattern 16A and the second electrode pattern 16B.

Alternatively, it is also acceptable to print a paste containing metal fine particles on the first transparent substrate 14A and the second transparent substrate 14B, and plate a metal on the paste to thereby form the first electrode pattern 16A and the second electrode pattern 16B.

When the first electrode pattern 16A and the second electrode pattern 16B are formed by the above described two production methods by light exposure, the present invention can also achieve an effect that a metal thin wire in the vicinity of an electrode terminal in a sensing region can be prevented from being thicker than an intended line width.

It is also acceptable to form the first electrode pattern 16A and the second electrode pattern 16B on the first transparent substrate 14A and the second transparent substrate 14B by printing, with a screen printing plate or a gravure printing plate. Alternatively, it is also acceptable to form the first electrode pattern 16A and the second electrode pattern 16B on the first transparent substrate 14A and the second transparent substrate 14B, with an ink-jet technique.

Figure 5B:
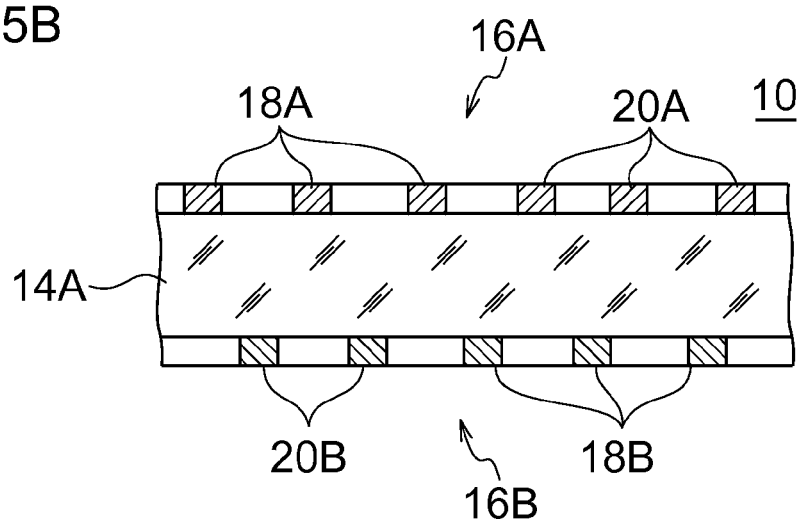
FIG. 5B is a sectional view illustrating another example of the electroconductive sheet for a touch panel, while omitting a part thereof.

As is illustrated in FIG. 5B, in the case where the first electrode pattern 16A is formed on one principal surface of the first transparent substrate 14A, and the second electrode pattern 16B is formed on the other principal surface of the first transparent substrate 14A, if a method of firstly exposing the one principal surface to light and then exposing the other principal surface to light is adopted according to a usual production method, there is the case where the first electrode pattern 16A and the second electrode pattern 16B which have desired patterns cannot be obtained.

Then, a production method which is described below can be preferably adopted.

Specifically, layers of a photosensitive silver halide emulsion formed on both sides of the first transparent substrate 14A are collectively exposed to light to form the first electrode pattern 16A on the one principal surface of the first transparent substrate 14A and form the second electrode pattern 16B on the other principal surface of the first transparent substrate 14A.

Specific examples of this production method are described below.

Firstly, a long photosensitive material is produced. The photosensitive material has a first transparent substrate 14A, a layer of a photosensitive silver halide emulsion (hereinafter referred to as first photosensitive layer) formed on one principal surface of the first transparent substrate 14A, and a layer of a photosensitive silver halide emulsion (hereinafter referred to as second photosensitive layer) formed on the other principal surface of the first transparent substrate 14A.

Next, the photosensitive material is exposed to light. In this exposure treatment, the first photosensitive layer is subjected to first exposure treatment which irradiates the first transparent substrate 14A with light to expose the first photosensitive layer to light along a first exposure pattern, and the second photosensitive layer is subjected to second exposure treatment which irradiates the first transparent substrate 14A with light to expose the second photosensitive layer to light along a second exposure pattern (simultaneous light exposure of both sides).

For instance, while the long photosensitive material is transported in one direction, the first photosensitive layer is irradiated with first light (parallel light) through a first photomask, and the second photosensitive layer is irradiated with second light (parallel light) through a second photomask. The first light can be obtained by a procedure of converting the light which has been emitted from a first light source into the parallel light with a first collimating lens on the way, and the second light can be obtained by the procedure of converting the light which has been emitted from a second light source into the parallel light with a second collimating lens on the way.

In the above description, the case has been described where two light sources (first light source and second light source) are used, but a light which has been emitted from one light source may be divided into first light and second light through an optical system, and may irradiate the first photosensitive layer and the second photosensitive layer as the first light and the second light.

Subsequently, the photosensitive material after light exposure is subjected to the development treatment. Thereby, an electroconductive sheet 10 for a touch panel is produced, for instance, as is illustrated in FIG. 4B. The electroconductive sheet 10 for a touch panel has the first transparent substrate 14A, the first electrode pattern 16A along the first exposure pattern, which has been formed on one principal surface of the first transparent substrate 14A, and the second electrode pattern 16B along the second exposure pattern, which has been formed on the other principal surface of the first transparent substrate 14A. Incidentally, light exposure time and developing time for the first photosensitive layer and the second photosensitive layer variously vary depending on types of the first light source and the second light source, types of a developing solution and the like. Accordingly, preferable ranges of numerical values cannot be generally determined, but the light exposure time and the developing time are adjusted so that a development ratio becomes 100%.

In the production method according to the present embodiment, in the first exposure treatment, the first photomask is, for instance, arranged to be brought into close contact with the first photosensitive layer, and the first photosensitive layer is exposed to light by being irradiated with the first light emitted from the first light source arranged so as to face the first photomask toward the first photomask. The first photomask is constructed of a glass substrate formed of a transparent soda glass, and a mask pattern (first exposure pattern) formed on the glass substrate. Accordingly, by this first exposure treatment, a portion along the first exposure pattern which is formed on the first photomask, out of the first photosensitive layer, is exposed to light. A gap of about 2 nm or more and 10 μm or less may be provided between the first photosensitive layer and the first photomask 146a.

Similarly, in the second exposure treatment, the second photomask is, for instance, arranged to be brought into close contact with the second photosensitive layer, and the second photosensitive layer is exposed to light by being irradiated with the second light emitted from the second light source arranged so as to face the second photomask toward the second photomask. The second photomask is constructed of a glass substrate formed of a transparent soda glass, and a mask pattern (second exposure pattern) formed on the glass substrate, similarly to the first photomask. Accordingly, by this second exposure treatment, a portion along the second exposure pattern which is formed on the second photomask, out of the second photosensitive layer, is exposed to light. In this case, a gap of about 2 μm or more and 10 μm or less may be provided between the second photosensitive layer and the second photomask.

In the first exposure treatment and the second exposure treatment, the timing of the emission of the first light from the first light source and the timing of the emission of the second light from the second light source may be controlled to be the same or to be different. If the timings are the same, the first photosensitive layer and the second photosensitive layer can be simultaneously exposed to light in one exposure treatment, and the treatment period of time can be shortened.

Next, a method is mainly described that uses a photographic sensitive material of silver halide, which is a particularly preferable aspect, in the first electroconductive sheet 12A and the second electroconductive sheet 12B according to the present embodiment.

The method for producing the first electroconductive sheet 12A and the second electroconductive sheet 12B according to the present embodiment includes three following modes according to the forms of the photosensitive material and development treatment.

(1) An aspect of subjecting a monochrome photosensitive material of a photosensitive silver halide, which does not contain a physical development nucleus, to chemical development or thermal development, thereby forming a metal silver portion on the photosensitive material.

(2) An aspect of subjecting a monochrome photosensitive material of a photosensitive silver halide, which contains the physical development nucleus in a layer of a silver halide emulsion, to dissolution physical development, thereby forming a metal silver portion on the photosensitive material.

(3) An aspect of overlapping a monochrome photosensitive material of a photosensitive silver halide, which does not contain the physical development nucleus, with an image-receiving sheet having a non-photosensitive layer that contains the physical development nucleus, and subjecting the sheet to diffusion transfer development, thereby forming a metal silver portion on the non-photosensitive image-receiving sheet.

The above described aspect (1) is an integrated monochrome development type, and a translucent electroconductive film such as an optically transparent electroconductive film is formed on the photosensitive material. The developed silver to be obtained is chemically developed silver or thermally developed silver, and is highly active in a subsequent plating or physical development process, in a point of being a filament having a high specific surface.

In the above described aspect (2), silver halide particles around the periphery of the physical development nuclei are dissolved and are deposited on the development nuclei, in the exposed portion, and thereby the translucent electroconductive film such as the optically transparent electroconductive film is formed on the photosensitive material.

This is also an integrated monochrome development type. The development action is deposition onto the physical development nucleus, and accordingly the developed silver is highly active, but has a spherical shape which has a small specific surface.

In the above described aspect (3), silver halide particles are dissolved in an unexposed portion, and diffuse, and then are deposited on development nuclei on the image-receiving sheet, and thereby the translucent electroconductive film such as the optically transparent electroconductive film is formed on the image-receiving sheet. The aspect is a so-called separate type and is an aspect in which the image-receiving sheet is separated from the photosensitive material and is used.

Any aspect can select any development of negative type development treatment and reverse development treatment (in the case of the diffusion transfer method, the negative type development treatment is enabled when an autopositive type photosensitive material is used as a photosensitive material).

Here, structures of each layer of the first electroconductive sheet 12A and the second electroconductive sheet 12B according to the present embodiment are described in detail below.

[First Transparent Substrate 14A and Second Transparent Substrate 14B]

Materials of the first transparent substrate 14A and the second transparent substrate 14B include a plastic film, a plastic sheet and a glass plate. In particular, PET is preferable from the viewpoint of optical transparency, processability and the like.

[Layer of Silver Salt Emulsion]

A layer of a silver salt emulsion which forms the first electrode pattern 16A of the first electroconductive sheet 12A and the second electrode pattern 16B of the second electroconductive sheet 12B contains an additive such as a solvent and a dye, in addition to a silver salt and a binder.

The silver salt which is used in the present embodiment includes an inorganic silver salt such as a silver halide, and an organic silver salt such as silver acetate. In the present embodiment, it is preferable to use the silver halide which is excellent in characteristics as a photosensor.

The application amount of silver (amount of silver salt to be applied) in the layer of the silver salt emulsion is preferably 1 g/m$^2$ or more and 30 g/m$^2$ or less in terms of silver (converted into silver), more preferably is 1 g/m$^2$ or more and 25 g/m$^2$ or less, and further preferably is 5 g/m$^2$ or more and 20 g/m$^2$ or less. When the electroconductive sheet 10 for a touch panel is produced according to this application amount of silver in the above described range, a desired surface resistance can be obtained.

Binders which are used in the present embodiment include, for instance, gelatin, polyvinyl alcohol (PVA), polyvinylpyrrolidone (PVP), a polysaccharide such as starch, cellulose and a derivative thereof, polyethylene oxide, polyvinylamine, chitosan, polylysine, a polyacrylic acid, a polyalginic acid, a polyhyaluronic acid and a carboxycellulose. These binders have properties of neutrality, anionic properties, or cationic properties according to ionic properties of a functional group.

A content of the binder contained in the layer of the silver salt emulsion in the present embodiment is not limited in particular, and can be appropriately determined in a range of being capable of exerting dispersibility and adhesiveness. The content of the binder contained in the layer of the silver salt emulsion is preferably ¼ or more by a volume ratio of silver/binder, and more preferably is ½ or more. The volume ratio of silver/binder is preferably 100/1 or less, and more preferably is 50/1 or less. In addition, the volume ratio of silver/binder is further preferably 1/1 or more and 4/1 or less. The volume ratio of silver/binder is most preferably 1/1 to 3/1. When the volume ratio of silver/binder in the layer of the silver salt emulsion is set in this range, an electroconductive sheet for a touch panel can be obtained, which reduces the variation of resistance values and has a uniform surface resistance, even in the case where the application amount of silver has been adjusted. Incidentally, the volume ratio of silver/binder can be determined by converting the amount of the silver halide/the amount of the binder (weight ratio) in the raw material into the amount of silver/the amount of the binder (weight ratio), and further by converting the amount of silver/the amount of the binder (weight ratio) into the amount of silver/the amount of the binder (volume ratio).

<Solvent>

A solvent to be used for forming the layer of the silver salt emulsion is not limited in particular, but includes, for instance, water, an organic solvent (for instance, alcohols such as methanol, ketones such as acetone, amides such as formamide, sulfoxides such as dimethylsulfoxide, esters such as ethyl acetate, ethers and the like), an ionic liquid, and a mixed solvent thereof.

A content of the solvent to be used in the layer of the silver salt emulsion according to the present embodiment is in a range of 30 to 90 mass % with respect to the total mass of the silver salt, the binder and the like contained in the layer of the silver salt emulsion, and preferably is in a range of 50 to 80 mass %.

<Other Additives>

Various additives to be used in the present embodiment are not limited in particular, and well-known additives can be preferably used.

[Other Layer Structures]

A not-shown protective layer may be provided on the layer of the silver salt emulsion. A "protective layer" in the present embodiment means a layer formed of a binder such as gelatin and a polymer, and is formed on the layer of the silver salt emulsion having photosensitivity so as to exert an effect of preventing scratches and improving dynamic characteristics. The thickness is preferably 0.5 μm or less. A method of applying the protective layer and a method of forming the protective layer are not limited in particular, and a well-known application method and a well-known forming method can be appropriately selected. In addition, an undercoat layer, for instance, can also be provided under the layer of the silver salt emulsion.

Next, each step of a method for producing the first electroconductive sheet 12A and the second electroconductive sheet 12B is described below.

[Light Exposure]

The present embodiment includes the case where the first electrode pattern 16A and the second electrode pattern 16B are formed by a printing method, but except for the printing method, the first electrode pattern 16A and the second electrode pattern 16B are formed by light exposure, development and the like. Specifically, a photosensitive material having a silver salt containing layer or a photosensitive material having a photopolymer for photolithography applied thereon, any of which is provided on the first transparent substrate 14A and the second transparent substrate 14B, is exposed to light.

The light exposure can be conducted with the use of an electromagnetic wave. The electromagnetic wave includes, for instance, light such as visible light and ultraviolet light, and radioactive rays such as X-rays. Furthermore, a light source having a wavelength distribution may be used for the light exposure, and a light source having a particular wavelength may be used.

As for the light exposure method, a method through a glass mask and a pattern exposure method by laser drawing are preferable.

[Development Treatment]

In the present embodiment, after having been exposed to light, the layer of the emulsion is further subjected to development treatment. The development treatment can employ a technology of usual development treatment, which is used for a silver salt photographic film, a photographic printing paper, a film for print plate-making, an emulsion mask for a photomask and the like.

The development treatment in the present embodiment can include a fixing treatment which is conducted for the purpose of removing a silver salt in an unexposed portion and stabilizing the unexposed portion. The fixing treatment according to the present invention can employ a technology of fixing treatment, which is used for the silver salt photographic film, the photographic printing paper, the film for print plate-making, the emulsion mask for the photomask and the like.

A photosensitive material which has been subjected to the development and fixing treatments is preferably subjected to film hardening treatment, washing treatment and stabilizing treatment.

The mass of the metal silver contained in the exposed portion after the development treatment is preferably a content by percentage of 50 mass % or more with respect to the mass of the silver contained in the exposed portion before the light exposure, and further preferably of 80 mass % or more. It is preferable that the mass of the silver contained in the exposed portion be 50 mass % or more with respect to the mass of the silver contained in the exposed portion before the light exposure, in order that high electroconductivity can be obtained.

The electroconductive sheet is obtained through the above described steps. A surface resistance of the obtained electroconductive sheet is preferably 100 Ω/sq. or less, more preferably is 80 Ω/sq. or less, further preferably is 60 Ω/sq. or less, and still further preferably is 40 Ω/sq. or less. The lower the lower limit of the surface resistance is, the better the performance is. However, the lower limit is generally sufficient if being 0.01 Ω/sq., and even if the lower limit is 0.1 Ω/sq. or 1 Ω/sq., the electroconductive sheet is usable though depending on the application.

When the surface resistance is adjusted to such a range, even in such a large-sized touch panel having an area of 10 cm×10 cm or more, the position can be detected. In addition, the electroconductive sheet after the development treatment may be further subjected to treatment for enhancing electroconductivity such as calendar treatment and vapor treatment. The surface resistance can be adjusted to a desired surface resistance by the calendar treatment.

[Physical Development and Plating Treatment]

In the present embodiment, a physical development and/or a plating treatment may be conducted for making the above described metal silver portion carry electroconductive metal particles, for the purpose of enhancing the electroconductivity of the metal silver portion which has been formed by the above described light exposure and development treatment. In the present invention, it is acceptable to make the metal silver portion carry electroconductive metal particles by only any one of the physical development and the plating treatment, and it is also acceptable to make the metal silver portion carry the electroconductive metal particles by the physical development and the plating treatment in combination. Incidentally, a metal silver portion which has been subjected to the physical development and/or the plating treatment is also referred to as "electroconductive metal portion".

[Oxidation Treatment]

In the present embodiment, the metal silver portion after the development treatment, and the electroconductive metal portion formed by the physical development and/or the plating treatment are preferably subjected to oxidation treatment. By performing the oxidation treatment, when, for instance, a metal slightly deposits on an optically transparent portion, the metal can be removed and the transparency of the optically transparent portion can be made approximately 100%.

[Electrode Pattern]

A line width of the metal thin wire of the first electrode pattern 16A and the second electrode pattern 16B according to the present embodiment can be selected from 30 μm or less, but when the first electrode pattern 16A and the second electrode pattern 16B are used as materials of a touch panel, a lower limit of the line width of the metal thin wire is preferably 0.7 μm, more preferably is 1 μm, and further preferably is 2 μm. An upper limit of the line width of the metal thin wire is preferably 15 μm, more preferably is 9 μm, and further preferably is 7 μm.

A conventional electrode terminal employs a thick terminal (solid terminal) so as to have high electroconductivity, and a portion which becomes an electrode terminal by light exposure is irradiated with a large quantity of light. The line width of the electrode pattern is extremely small as in the above description, and is occasionally affected by the large quantity of light. When the line width is 9 μm or less and further is 7 μm or less, in particular, the influence becomes remarkable, and there has been a problem that the metal thin wire in the vicinity of the electrode terminal becomes thicker than an intended line width.

A line space (lattice pitch) is preferably 100 μm or more and 400 μm or less, and further preferably is 200 μm or more and 300 μm or less. In addition, the metal thin wire may have a portion wider than 200 μm, for the purpose of ground connection and the like.

[Optically Transparent Portion]

An "optically transparent portion" in the present embodiment means a portion having translucency, which excludes the first electrode pattern 16A and the second electrode pattern 16B out of the first electroconductive sheet 12A and the second electroconductive sheet 12B. As for transmittance in the optically transparent portion, the transmittance is 83% or more as has been described above, which is represented by a minimum value of transmittance in a wavelength region of 380 to 780 nm and excludes the contribution of optical absorption and reflection in the first transparent substrate 14A and the second transparent substrate 14B. The minimum value of transmittance is preferably 85% or more, is further preferably 90% or more, is further more preferably 93% or more, and is most preferably 99% or more.

[First Electroconductive Sheet 12A and Second Electroconductive Sheet 12B]

Thicknesses of the first transparent substrate 14A and the second transparent substrate 14B in the first electroconductive sheet 12A and the second electroconductive sheet 12B according to the present embodiment are each preferably 5 μm or more and 350 μm or less, and further preferably are 30 μm or more and 150 μm or less. If the thickness is in the range of 5 μm or more and 350 μm or less, a desired transmittance of visible light is obtained and the electroconductive sheet is also easily handled.

Thicknesses of the metal silver portions provided on the first transparent substrate 14A and the second transparent substrate 14B can be appropriately determined according to the thicknesses of coatings for the silver salt containing layer, which are applied onto the first transparent substrate 14A and the second transparent substrate 14B. The thickness of the metal silver portion can be selected from 0.001 mm or more and 0.2 mm or less, but preferably is 30 μm or less, more preferably is 20 μm or less, further preferably is 0.01 μm or more and 9 μm or less, and most preferably is 0.05 μm or more and 5 μm or less. In addition, the metal silver portion preferably forms a pattern shape. The metal silver portion may be formed of one layer, and may also be a multilayer structure of two or more layers. When the metal silver portion forms the pattern shape and is the multilayer structure of two or more layers, different color sensitivities can be given to the structure so as to be capable of being sensitized to different wavelengths. Thereby, when each layer is exposed to light having a changed light exposure wavelength, different patterns can be formed on the layers.

As the thickness of the electroconductive metal portion is thinner, a viewing angle of a display panel becomes wider, which is preferable for application of a touch panel, and it is required to thin the film also from the point of enhancing the visibility. From such a viewpoint, the thickness of the layer formed of the electroconductive metal which is carried on the electroconductive metal portion is preferably less than 9 µm, more preferably is 0.1 µm or more and less than 5 µm, and further preferably is 0.1 µm or more and less than 3 µm.

In the present embodiment, the thickness of the above described applied silver salt containing layer is controlled, thereby a metal silver portion having a desired thickness is formed. Furthermore, because the thickness of the layer formed of the electroconductive metal particles can be freely controlled by the physical development and/or the plating treatment, the first electroconductive sheet 12A and the second electroconductive sheet 12B even having a thickness of less than 5 µm and preferably of less than 3 µm can be easily formed.

It is needless to say that an electroconductive sheet and a touch panel according to the present invention are not limited to the above described embodiments and can adopt various structures without departing from the gist of the present invention. In addition, the electroconductive sheet and the touch panel can be used while being appropriately combined with technologies disclosed in Japanese Patent Application Laid-Open No. 2011-113149, Japanese Patent Application Laid-Open No. 2011-129501, Japanese Patent Application Laid-Open No. 2011-129112, Japanese Patent Application Laid-Open No. 2011-134311, Japanese Patent Application Laid-Open No. 2011-175628 and the like.

EXAMPLES

The present invention is more specifically described below with reference to examples of the present invention. Incidentally, materials, amounts to be used, ratios, contents of treatment, treatment procedures and the like, which are described in the following examples, can be appropriately changed unless they deviate from the scope of the present invention. Accordingly, the scope of the present invention should not be restrictively interpreted by the specific examples which are described below.

A transmittance or an aperture ratio was measured and visibility was evaluated for a multilayered electroconductive sheet relating to each sample.

(Silver Halide Photosensitive Material)

An emulsion was prepared which contained 10.0 g of gelatin with respect to 150 g of Ag in an aqueous medium and contained silver iodobromochloride particles (I=0.2 mol % and Br=40 mol %) with a sphere equivalent mean diameter of 0.1 µm.

In addition, K3Rh2Br9 and K2IrCl6 were added into this emulsion so that the concentration became $10^{-7}$ (mole/mole silver), thereby doping the silver bromide particles with a Rh ion and an Ir ion. Into this emulsion, Na2PdCl4 was added, and the resultant emulsion was further subjected to gold sulfur sensitization with the use of chloroauric acid and sodium thiosulfate, and then was applied onto the first transparent substrate 14A and the second transparent substrate 14B (here, both are polyethylene terephthalate (PET)) together with a gelatin hardener so that the amount of silver in coating was 10 g/m². At this time, the volume ratio of Ag/gelatin was controlled to be 2/1.

The emulsion was applied onto a PET substrate having a width of 30 cm with a width of 25 cm and at 20 m per minute, and both ends of the PET support were cut off by 3 cm so as to leave 24 cm of a central part of the coated portion, and a silver halide photosensitive material with a rolled form was obtained.

(Light Exposure)

Patterns of light exposure for the first electroconductive sheet 12A were patterns illustrated in FIG. 1 and FIG. 3, and patterns of light exposure for the second electroconductive sheet 12B were patterns illustrated in FIG. 4A, FIG. 4B and FIG. 6B. The first transparent substrate 14A and the second transparent substrate 14B with an A4 size (210 mm×297 mm) were exposed to light. The light exposure was conducted by using a parallel light which was emitted from a high pressure mercury lamp of a light source, through photomasks of the above described patterns. Incidentally, samples of the electrode terminal 60A and the electrode terminal 60B of the first electroconductive sheet 12A and the second electroconductive sheet 12B were each prepared with every pattern illustrated in FIGS. 1 to 3.

(Development Treatment)

Formulation of 1 L of Developing Solution

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | adjusted to 10.3 |

Formulation of 1 L of Fixing Solution

| | |
|---|---|
| Ammonium thiosulfate liquid (75%) | 300 ml |
| Ammonium sulfite monohydrate | 25 g |
| 1,3-diaminopropane tetraacetic acid | 8 g |
| Acetic acid | 5 g |
| Ammonia water (27%) | 1 g |
| pH | adjusted to 6.2 |

The photosensitive material which was exposed to light was subjected to an automatic developing machine FG-710PTS made by FUJIFILM Corporation by using the above described treatment agents, and was treated on treatment conditions of: development at 35° C. for 30 seconds, fixing at 34° C. for 23 seconds, and washing by running water (5 L/min) for 20 seconds.

Experiment 1

(Sample 1-1) Example

The electroconductive parts (first electrode pattern 16A and second electrode pattern 16B) of the produced first electroconductive sheet 12A and the second electroconductive sheet 12B have transmittances of 83%. The electrode terminal 60A and the electrode terminal 60B of the produced first electroconductive sheet 12A and the second electroconductive sheet 12B have patterns shown in FIG. 1 and transmittances of 63%.

(Sample 1-2) Example

Sample 1-2 was prepared similarly to Sample 1-1 except that the transmittances of the electrode terminal 60A and the electrode terminal 60B of the produced first electroconductive sheet 12A and the second electroconductive sheet 12B were controlled to be 80%.

(Sample 1-3) Comparative Example

Sample 1-3 was prepared similarly to Sample 1-1 except that the transmittances of the electrode terminal 60A and the electrode terminal 60B of the produced first electroconductive sheet 12A and the second electroconductive sheet 12B were controlled to be 60%.

(Sample 1-4) Comparative Example

Sample 1-4 was prepared similarly to Sample 1-1 except that the transmittances of the electrode terminal 60A and the electrode terminal 60B of the produced first electroconductive sheet 12A and the second electroconductive sheet 12B were controlled to be 83%.

(Sample 1-5) Example

The electroconductive parts (first electrode pattern 16A and second electrode pattern 16B) of the produced first electroconductive sheet 12A and the second electroconductive sheet 12B have transmittances of 90%. The electrode terminal 60A and the electrode terminal 60B of the produced first electroconductive sheet 12A and the second electroconductive sheet 12B have patterns shown in FIG. 1 and transmittances of 70%.

(Sample 1-6) Example

Sample 1-6 was prepared similarly to Sample 1-5 except that the transmittances of the electrode terminal 60A and the electrode terminal 60B of the produced first electroconductive sheet 12A and the second electroconductive sheet 12B were controlled to be 87%.

(Sample 1-7) Comparative Example

Sample 1-7 was prepared similarly to Sample 1-5 except that the transmittances of the electrode terminal 60A and the electrode terminal 60B of the produced first electroconductive sheet 12A and the second electroconductive sheet 12B were controlled to be 67%.

(Sample 1-8) Comparative Example

Sample 1-8 was prepared similarly to Sample 1-5 except that the transmittances of the electrode terminal 60A and the electrode terminal 60B of the produced first electroconductive sheet 12A and the second electroconductive sheet 12B were controlled to be 90%.

(Sample 1-9) Example

The electroconductive parts (first electrode pattern 16A and second electrode pattern 16B) of the produced first electroconductive sheet 12A and the second electroconductive sheet 12B have transmittances of 83%. The electrode terminal 60A and the electrode terminal 60B of the produced first electroconductive sheet 12A and the second electroconductive sheet 12B have patterns shown in FIG. 2 and transmittances of 63%.

(Sample 1-10) Example

Sample 1-10 was prepared similarly to Sample 1-9 except that the transmittances of the electrode terminal 60A and the electrode terminal 60B of the produced first electroconductive sheet 12A and the second electroconductive sheet 12B were controlled to be 80%.

(Sample 1-11) Comparative Example

Sample 1-11 was prepared similarly to Sample 1-9 except that the transmittances of the electrode terminal 60A and the electrode terminal 60B of the produced first electroconductive sheet 12A and the second electroconductive sheet 12B were controlled to be 60%.

(Sample 1-12) Comparative Example

Sample 1-12 was prepared similarly to Sample 1-9 except that the transmittances of the electrode terminal 60A and the electrode terminal 60B of the produced first electroconductive sheet 12A and the second electroconductive sheet 12B were controlled to be 83%.

(Sample 1-13) Example

The electroconductive parts (first electrode pattern 16A and second electrode pattern 16B) of the produced first electroconductive sheet 12A and the second electroconductive sheet 12B have transmittances of 83%. The electrode terminal 60A and the electrode terminal 60B of the produced first electroconductive sheet 12A and the second electroconductive sheet 12B have patterns shown in FIG. 3 and transmittances of 63%.

(Sample 1-14) Example

Sample 1-14 was prepared similarly to Sample 1-13 except that the transmittances of the electrode terminal 60A and the electrode terminal 60B of the produced first electroconductive sheet 12A and the second electroconductive sheet 12B were controlled to be 80%.

(Sample 1-15) Comparative Example

Sample 1-15 was prepared similarly to Sample 1-13 except that the transmittances of the electrode terminal 60A and the electrode terminal 60B of the produced first electroconductive sheet 12A and the second electroconductive sheet 12B were controlled to be 60%.

(Sample 1-16) Comparative Example

Sample 1-16 was prepared similarly to Sample 1-13 except that the transmittances of the electrode terminal 60A and the electrode terminal 60B of the produced first electroconductive sheet 12A and the second electroconductive sheet 12B were controlled to be 83%.

<Measurement of Transmittance>

Total luminous transmittance was measured for the first electroconductive sheet 12A and the second electroconductive sheet 12B with the use of a photometer. A photometer TC-HIIIDPK made by Tokyo Denshoku.co., Ltd. was used for the measurement.

<Evaluation of Visibility>

Projected capacitive touch panels were produced with the use of each of the multilayered electroconductive sheets relating to the above described samples. Each touch panel was installed on a turntable, a liquid crystal display device was driven and white was displayed. At this time, it was visually checked whether a shadow (portion which becomes dark) could be recognized or not, in the vicinity of an electrode terminal of a sensing region.

The touch panel having superior visibility was evaluated as A, the touch panel having adequate (good) visibility was evaluated as B, the touch panel in which the visibility was not practically affected was evaluated as C, and the touch panel having inferior visibility was evaluated as D.

<Evaluation of Response Speed>

The touch panel having a superior response speed was evaluated as A, the touch panel having an adequate response speed was evaluated as B, the touch panel in which a response speed did not practically become a problem was evaluated as C, and the touch panel which had a slow response speed and was inferior in detection sensitivity was evaluated as D.

TABLE 1

| Sample No. | Electrode terminal Shape | Electrode terminal Corresponding FIG. | Transmittance of electroconductive part | Transmittance of electrode terminal | Evaluation Visibility | Evaluation Response speed |
| --- | --- | --- | --- | --- | --- | --- |
| 1-1 | Frame | FIG. 1 | 88% | 68% | C | A |
| 1-2 | Frame | FIG. 1 | 88% | 80% | A | A |
| 1-3 | Frame | FIG. 1 | 88% | 60% | D | A |
| 1-4 | Frame | FIG. 1 | 88% | 87% | A | C |
| 1-5 | Frame | FIG. 1 | 91% | 72% | C | B |
| 1-6 | Frame | FIG. 1 | 91% | 84% | A | B |
| 1-7 | Frame | FIG. 1 | 91% | 64% | D | B |
| 1-8 | Frame | FIG. 1 | 91% | 90% | A | C |
| 1-9 | Mesh | FIG. 2 | 88% | 68% | C | A |
| 1-10 | Mesh | FIG. 2 | 88% | 84% | A | A |
| 1-11 | Mesh | FIG. 2 | 88% | 60% | D | A |
| 1-12 | Mesh | FIG. 2 | 88% | 87% | A | C |
| 1-13 | Frame + mesh | FIG. 3 | 88% | 68% | C | A |
| 1-14 | Frame + mesh | FIG. 3 | 88% | 84% | A | A |
| 1-15 | Frame + mesh | FIG. 3 | 88% | 60% | D | A |
| 1-16 | Frame + mesh | FIG. 3 | 88% | 87% | A | C |

<Result 1>

As understood from Table 1, the samples which had transmittances in the range according to the present invention out of the samples 1-1 to 1-16 showed adequate visibility. In addition, when the touch panels were touched and operated by a finger, it was found that the samples which had transmittances in the range according to the present invention out of the samples 1-1 to 1-16 had a fast response speed and were excellent in detection sensitivity. Furthermore, when the touch panels were touched at two or more points and operated, the touch panels showed adequate results similarly. Thus, it was confirmed that the touch panels also could cope with multitouch.

Experiment 2

(Sample 2-1) Example

The electroconductive parts (first electrode pattern 16A and second electrode pattern 16B) of the produced first electroconductive sheet 12A and the second electroconductive sheet 12B have aperture ratios of 90%. The electrode terminal 60A and the electrode terminal 60B of the produced first electroconductive sheet 12A and the second electroconductive sheet 12B have patterns shown in FIGS. 5A and 5B, and aperture ratios of 70%.

(Sample 2-2) Example

Sample 2-2 was prepared similarly to Sample 2-1 except that the aperture ratios of the electrode terminal 60A and the electrode terminal 60B of the produced first electroconductive sheet 12A and the second electroconductive sheet 12B were controlled to be 89.9%.

(Sample 2-3) Comparative Example

Sample 2-3 was prepared similarly to Sample 2-1 except that the aperture ratios of the electrode terminal 60A and the electrode terminal 60B of the produced first electroconductive sheet 12A and the second electroconductive sheet 12B were controlled to be 68%.

(Sample 2-4) Comparative Example

Sample 2-4 was prepared similarly to Sample 2-1 except that the aperture ratios of the electrode terminal 60A and the electrode terminal 60B of the produced first electroconductive sheet 12A and the second electroconductive sheet 12B were controlled to be 90%.

(Sample 2-5) Example

The electroconductive parts (first electrode pattern 16A and second electrode pattern 16B) of the produced first electroconductive sheet 12A and the second electroconductive sheet 12B have aperture ratios of 97%. The electrode terminal 60A and the electrode terminal 60B of the produced first electroconductive sheet 12A and the second electroconductive sheet 12B have patterns shown in FIGS. 5A and 5B, and aperture ratios of 77%.

(Sample 2-6) Example

Sample 2-6 was prepared similarly to Sample 2-5 except that the aperture ratios of the electrode terminal 60A and the electrode terminal 60B of the produced first electroconductive sheet 12A and the second electroconductive sheet 12B were controlled to be 96.9%.

(Sample 2-7) Comparative Example

Sample 2-7 was prepared similarly to Sample 2-5 except that the aperture ratios of the electrode terminal 60A and the electrode terminal 60B of the produced first electroconductive sheet 12A and the second electroconductive sheet 12B were controlled to be 75%.

(Sample 2-8) Comparative Example

Sample 2-8 was prepared similarly to Sample 2-5 except that the aperture ratios of the electrode terminal 60A and the electrode terminal 60B of the produced first electroconductive sheet 12A and the second electroconductive sheet 12B were controlled to be 97%.

(Sample 2-9) Example

The electroconductive parts (first electrode pattern 16A and second electrode pattern 16B) of the produced first electroconductive sheet 12A and the second electroconductive sheet 12B have aperture ratios of 90%. The electrode terminal 60A and the electrode terminal 60B of the produced first electroconductive sheet 12A and the second electroconductive sheet 12B have patterns shown in FIGS. 6A and 6B, and the aperture ratios of 70%.

(Sample 2-10) Example

Sample 2-10 was prepared similarly to Sample 2-9 except that the aperture ratios of the electrode terminal 60A and the electrode terminal 60B of the produced first electroconductive sheet 12A and the second electroconductive sheet 12B were controlled to be 89.9%.

(Sample 2-11) Comparative Example

Sample 2-11 was prepared similarly to Sample 2-9 except that the aperture ratios of the electrode terminal 60A and the electrode terminal 60B of the produced first electroconductive sheet 12A and the second electroconductive sheet 12B were controlled to be 68%.

(Sample 2-12) Comparative Example

Sample 2-12 was prepared similarly to Sample 2-9 except that the aperture ratios of the electrode terminal 60A and the electrode terminal 60B of the produced first electroconductive sheet 12A and the second electroconductive sheet 12B were controlled to be 90%.

(Sample 2-13) Example

The electroconductive parts (first electrode pattern 16A and second electrode pattern 16B) of the produced first electroconductive sheet 12A and the second electroconductive sheet 12B have aperture ratios of 90%. The electrode terminal 60A and the electrode terminal 60B of the produced first electroconductive sheet 12A and the second electroconductive sheet 12B have patterns shown in FIG. 7 and the aperture ratios of 70%.

(Sample 2-14) Example

Sample 2-14 was prepared similarly to Sample 2-13 except that the aperture ratios of the electrode terminal 60A and the electrode terminal 60B of the produced first electroconductive sheet 12A and the second electroconductive sheet 12B were controlled to be 89.9%.

(Sample 2-15) Comparative Example

Sample 2-15 was prepared similarly to Sample 2-13 except that the aperture ratios of the electrode terminal 60A and the electrode terminal 60B of the produced first electroconductive sheet 12A and the second electroconductive sheet 12B were controlled to be 68%.

(Sample 2-16) Comparative Example

Sample 2-16 was prepared similarly to Sample 2-13 except that the aperture ratios of the electrode terminal 60A and the electrode terminal 60B of the produced first electroconductive sheet 12A and the second electroconductive sheet 12B were controlled to be 90%.

<Measurement of Aperture Ratio>

The aperture ratios of the first electroconductive sheet 12A and the second electroconductive sheet 12B were measured with a magnification of 3,000 (3,000 times power) using a microscope VHX-200 made by KEYENCE CORPORATION.

<Evaluation of Visibility>

Projected capacitive touch panels were produced with the use of each of the multilayered electroconductive sheets relating to the above described samples. Each touch panel was installed on a turntable, a liquid crystal display device was driven and white was displayed. At this time, it was visually checked whether a shadow (portion which becomes dark) could be recognized or not in the vicinity of an electrode terminal of a sensing region.

The touch panel having superior visibility was evaluated as A, the touch panel having adequate (good) visibility was evaluated as B, the touch panel in which the visibility was not practically affected was evaluated as C, and the touch panel having inferior visibility was evaluated as D.

<Evaluation of Response Speed>

The touch panel having a superior response speed was evaluated as A, the touch panel having an adequate response speed was evaluated as B, the touch panel in which a response speed did not practically become a problem was evaluated as C, and the touch panel which had a slow response speed and was inferior in detection sensitivity was evaluated as D.

TABLE 2

| Sample No. | Electrode terminal Shape | Corresponding FIG. | Aperture ratio of electroconductive part | Aperture ratio of electrode terminal | Evaluation Visibility | Response speed |
|---|---|---|---|---|---|---|
| 2-1 | Frame | FIG. 1 | 96% | 82% | C | A |
| 2-2 | Frame | FIG. 1 | 96% | 87.0% | A | A |
| 2-3 | Frame | FIG. 1 | 96% | 75% | D | A |
| 2-4 | Frame | FIG. 1 | 96% | 95% | A | C |
| 2-5 | Frame | FIG. 1 | 99% | 85% | C | B |

TABLE 2-continued

| Sample No. | Electrode terminal Shape | Corresponding FIG. | Aperture ratio of electroconductive part | Aperture ratio of electrode terminal | Evaluation Visibility | Response speed |
|---|---|---|---|---|---|---|
| 2-6 | Frame | FIG. 1 | 99% | 87.0% | A | B |
| 2-7 | Frame | FIG. 1 | 99% | 78% | D | B |
| 2-8 | Frame | FIG. 1 | 99% | 98% | A | C |
| 2-9 | Mesh | FIG. 2 | 96% | 82% | C | A |
| 2-10 | Mesh | FIG. 2 | 96% | 87.0% | A | A |
| 2-11 | Mesh | FIG. 2 | 96% | 75% | D | A |
| 2-12 | Mesh | FIG. 2 | 96% | 95% | A | C |
| 2-13 | Frame + mesh | FIG. 3 | 96% | 82% | C | A |
| 2-14 | Frame + mesh | FIG. 3 | 96% | 87.0% | A | A |
| 2-15 | Frame + mesh | FIG. 3 | 96% | 75% | D | A |
| 2-16 | Frame + mesh | FIG. 3 | 96% | 95% | A | C |

<Result 2>

As is understood from Table 2, the samples which had an aperture ratios in the range according to the present invention out of the samples 2-1 to 2-16 showed adequate visibility. In addition, when the touch panels were touched and operated by a finger, it was found that the samples which had the aperture ratios in the range according to the present invention out of the samples 2-1 to 2-16 had a fast response speed and were excellent in detection sensitivity. Furthermore, when the touch panels were touched at two or more points and operated, the touch panels showed an adequate results similarly. Thus, it was confirmed that the touch panels also could cope with multitouch.

It is needless to say that the electroconductive sheet and the touch panel according to the present invention are not limited to the above described embodiments and can adopt various structures without departing from the gist of the present invention.

What is claimed is:

1. An electroconductive sheet comprising:
    an electrode pattern constructed of a metal thin wire; and
    an electrode terminal that is electrically connected to an end of the electrode pattern, wherein
    a transmittance of the electrode pattern is 83% or more, and when the transmittance of the electrode pattern is represented by a %, a transmittance of the electrode terminal is (a-20)% or more and (a-3)% or less.

2. An electroconductive sheet comprising:
    an electrode pattern constructed of a metal thin wire; and
    an electrode terminal that is electrically connected to an end of the electrode pattern, wherein
    an aperture ratio of the electrode pattern is 90% or more, and when the aperture ratio of the electrode pattern is represented by b %, an aperture ratio of the electrode terminal is (b-20)% or more and (b-0.1)% or less.

3. The electroconductive sheet according to claim 1, wherein the electrode terminal includes a mesh shape formed of lattices constructed of a metal thin wire.

4. The electroconductive sheet according to claim 3, wherein the metal thin wire has a line width of 30 µm or less.

5. The electroconductive sheet according to claim 3, wherein the metal thin wire is made from an opaque material.

6. An electroconductive sheet comprising:
    an electrode pattern constructed of a metal thin wire; and
    an electrode terminal that is electrically connected to an end of the electrode pattern, wherein
    the electrode terminal includes a frame shape constructed of a metal thin wire.

7. The electroconductive sheet according to claim 6, wherein
    when a line width of the thin wire of the electrode pattern is represented by a (µm), a line width b (µm) of the frame shape of the electrode terminal satisfies b≥2a or b≥a+5 (µm).

8. The electroconductive sheet according to claim 7, wherein the line width a (µm) of the thin wire of the electrode pattern is 30 µm or less.

9. The electroconductive sheet according to claim 7, further comprising
    a mesh shape provided in the frame shape of the electrode terminal constructed of the metal thin wire, the mesh shape which is formed of lattices constructed of a metal thin wire.

* * * * *